United States Patent
Neff

(10) Patent No.: US 6,956,423 B2
(45) Date of Patent: Oct. 18, 2005

(54) INTERLEAVED CLOCK SIGNAL GENERATOR HAVING SERIAL DELAY AND RING COUNTER ARCHITECTURE

(75) Inventor: Robert M. R. Neff, Palo Alto, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/061,504

(22) Filed: Feb. 1, 2002

(65) Prior Publication Data

US 2003/0151441 A1 Aug. 14, 2003

(51) Int. Cl.$^7$ ................................................ G06F 1/04
(52) U.S. Cl. ...................................... 327/291; 327/292
(58) Field of Search ................................ 327/291–299, 327/263, 269, 271, 273, 279, 284, 286, 415; 531/11, 45

(56) References Cited

U.S. PATENT DOCUMENTS

| | | | | |
|---|---|---|---|---|
| 4,430,745 A | * | 2/1984 | Betts | 375/377 |
| 5,039,950 A | | 8/1991 | McDermott | 327/144 |
| 5,155,388 A | | 10/1992 | Corcoran | 326/35 |
| 5,268,656 A | * | 12/1993 | Muscavage | 331/45 |
| 5,371,773 A | * | 12/1994 | Ihara et al. | 377/56 |
| 5,477,181 A | | 12/1995 | Li et al. | 327/258 |
| 5,828,717 A | * | 10/1998 | Kusumoto et al. | 377/24 |
| 5,847,588 A | | 12/1998 | McDermott | 327/144 |
| 6,259,281 B1 | | 7/2001 | Neff | 327/91 |
| 6,275,072 B1 | * | 8/2001 | Dally et al. | 327/7 |

FOREIGN PATENT DOCUMENTS

EP        0 487 902 A     6/1998

* cited by examiner

*Primary Examiner*—Linh My Nguyen
(74) *Attorney, Agent, or Firm*—Ian Hardcastle

(57) ABSTRACT

The interleaved clock generator generates N interleaved clock signals in response to an input clock signal. The interleaved clock generator comprises an interleaved clock generator of a first type for receiving the input clock signal and for generating M interleaved intermediate clock signals in response to the input clock signal. The interleaved clock generator of the first type includes either a multi-stage serial-delay circuit or a ring counter circuit. The interleaved clock generator additionally comprises M interleaved clock generators of a second type, each of which is each for receiving a respective one of the intermediate clock signals from the clock generator of the first type and for generating N/M of the N interleaved clock signals in response to the respective one of the intermediate clock signals. Each of the interleaved clock generators of the second type includes either a ring counter circuit or a multi-stage serial-delay circuit: a ring counter when the interleaved clock generator of the first type includes a multi-stage serial-delay circuit; a multi-stage serial-delay circuit when the interleaved clock generator of the first type includes a ring counter circuit.

25 Claims, 12 Drawing Sheets

_US 6,956,423 B2_

INTERLEAVED CLOCK SIGNAL GENERATOR HAVING SERIAL DELAY AND RING COUNTER ARCHITECTURE

BACKGROUND OF THE INVENTION

Many types of analog-to-digital converters, digital-to-analog converters, interleaved sampling circuits, serial links and other electronic circuits operate in response to interleaved clock signals. Accordingly, such circuits typically include an interleaved clock generator, or receive interleaved clock signals from an interleaved clock generator.

An interleaved clock generator receives an input clock signal and, in response to the input clock signal, generates a set of N interleaved clock signals. The interleaved clock signals have edges that are temporally equally spaced within the time period of one of the interleaved clock signals. Important design variables for an interleaved clock generator include the number of interleaved clock signals (N) and the time delay (Td) between corresponding edges of adjacent ones of the interleaved clock signals. For example, the time delay Td is the time delay between the positive-going edges of adjacent interleaved clock signals p and p+1, where $1 \leq p \leq N-1$.

FIG. 1A is a block diagram showing an example 10 of an interleaved clock generator that generates four interleaved clock signals, i.e., N=4 in the example shown. The interleaved clock generator 10 includes the clock input 12 and the four clock outputs 14-1, 14-2, 14-3 and 14-4 at which the interleaved clock signals K1, K2, K3 and K4, respectively, are output.

FIG. 1B shows the waveforms of the interleaved clock signals K1, K2, K3 and K4. The positive-going edges of all four interleaved clock signal waveforms are temporally equally spaced within the period of the interleaved clock signals, e.g., over the period t of the interleaved clock signal K1. The time delay between the positive-going edges of the waveforms of the adjacent interleaved clock signals K1 and K2 is indicated as Td.

Desirable performance characteristics of the interleaved clock generator 10 include that the interleaved clock generator generate a large number N of interleaved clock signals with a small time delay Td between corresponding edges of adjacent ones of the interleaved clock signals, and that the interleaved clock signals have small timing errors and low jitter. Timing errors include fixed timing offsets and cycle-to-cycle mismatches. Timing offsets are typically caused by mismatches between the stages of the interleaved clock generator that generate the individual interleaved clock signals. Cycle-to-cycle mismatches are typically caused by noise. Sources of noise include thermal noise in the interleaved clock generator and noise received from external sources, such as noise from a noisy power supply. Generally, the magnitude of the timing errors depends on the number of stages through which the input clock signal propagates to generate each individual interleaved clock signal.

Many conventional interleaved clock generators incorporate a ring counter. Other conventional interleaved clock generators incorporate a multi-stage serial-delay circuit. FIG. 2A is a block diagram of an example of a conventional interleaved clock generator 10 based exclusively on a ring counter 20. In the example shown, the ring counter is composed of four stages. Each of the four stages generates one of the four interleaved clock signals K1–K4 in response to the input clock signal K0.

The four-stage ring counter 20 is composed of the four stages 22-1, 22-2, 22-3 and 22-4. Each of the stages includes a data input D, a clock input CK and a data output Q. The data output of each stage 22-1 to 22-4 provides one of the interleaved clock signals K1–K4, respectively, and is connected to the respective one of the clock outputs 14-1 to 14-4 of the interleaved clock generator 10. The data output of each of the stages 22-1, 22-2 and 22-3 is additionally connected to the data input of the stages 22-2, 22-3 and 22-4, respectively. The data output of the stage 22-4 provides the interleaved clock signal K4 and is additionally connected to the data input of the stage 22-1. The clock input CK of each of the stages is connected to the input clock input 12.

Each of the stages 22-1 to 22-4 is configured such that the state of its data output Q is set to a predetermined state when power is applied. For example, each stage may additionally include a present input (not shown) connected to a preset line (not shown) that is asserted at power on to set the state of the data output to the predetermined state.

FIG. 2B shows waveforms of the input clock signal K0 and of the interleaved clock signals K1–K4 in an example of a conventional interleaved clock generator based exclusively on the ring counter 20. The interleaved clock signals K1–K4 are output by the stages 22-1 to 22-4, respectively. In the example shown, the output of one of the stages is preset to a 1 (high) state and the outputs of the remaining stages are preset to a 0 (low) state at power on. However, this is not critical: the outputs of the stages may be preset to any state provided that the outputs of a contiguous block composed of at least one of the stages differ in state from those of the remaining stages.

On each positive-going edge of the input clock signal K0 received at the input clock input 12, each of the stages 22-1 to 22-4 sets the state of its data output Q to the state present at its data input D. FIG. 2B shows an example in which the data output of stage 22-1 is preset to a 1 state and the data outputs of stages 22-2 to 22-4 are preset to a 0 state at power on. The 0 state output by stage 22-4 is present at the input of stage 22-1. The next positive-going edge of the input clock signal, shown at 31, sets the output of stage 22-1 (interleaved clock signal K1) to a 0 state, as shown at 32. Moreover, the positive-going edge of the input clock signal sets the output of stage 22-2 (interleaved clock signal K2) to a 1 state, as shown at 33, as a result of presence of the 1 state output by stage 22-1 at the input of stage 22-2. Corresponding changes occur in the outputs of stages 22-2 and 22-3, 22-3 and 22-4, and 22-4 and 22-1 on the positive-going edges 34, 35 and 36, respectively, of the input clock signal. Positive-going edge 36 restores the outputs of the stages to their original state that existed between power-on and positive-going edge 31, and the above-described sequence repeats.

In a ring counter-based interleaved clock generator, such as that shown in FIG. 2A, the frequency of the input clock signal K0 is 1/Td, where Td is the desired time delay between corresponding edges of adjacent ones of the interleaved clock signals K1–KN, and the frequency of each of the interleaved clock signals K0 is 1/(Td*N). Consequently, in a ring counter-based interleaved clock generator that generates N interleaved clock signals, the frequency of the input clock signal is N times that of the interleaved clock signals.

The interleaved clock generator based on the ring counter 20 has a number of practical advantages. The circuit from the input clock input 12 to each of the clock outputs 14-1 to 14-4 can be made similar for each of the clock outputs. The circuit from the clock input 12 to each of the clock outputs 14-1 to 14-4 can also be designed for minimum delay. These measures minimize timing errors and jitter in the interleaved clock signals K1–K4.

However, in an interleaved clock generator, the desired time delay Td and the number N of interleaved clock signals depends on the requirements of the circuit to which the interleaved clock signals are supplied. Current trends are towards reducing the time delay and increasing the number of interleaved clock signals. In an interleaved clock generator based on the ring counter 20, these trends significantly and the above-described input clock frequency multiplication factor significantly increase the frequency of the input clock signal. A very high input clock signal frequency makes it difficult both to design the input clock signal generator and to propagate the input clock signal from the input clock signal generator to the ring counter. The maximum frequency of the input clock signal that can be generated for a given power consumption by an input clock signal generator having a given circuit configuration and device feature size limits the maximum frequency of the input clock signal and, hence, imposes a practical minimum on the time delay Td. This minimum can be greater than the time delay required in modern applications.

FIG. 3A is a block diagram of an example of a conventional interleaved clock generator 10 based exclusively on a multi-stage serial-delay circuit 40. In the example shown, the multi-stage serial-delay circuit is composed of four delay stages. Each of the four delay stages generates one of the four interleaved clock signals K1–K4. The circuit operates in response to the input clock signal K0.

The four-stage serial-delay circuit 40 is composed of the four delay stages 42-1, 42-2, 42-3 and 42-4 connected in series. Each of the delay stages includes a data input D and a data output Q. The data output of each of the delay stages 42-1, 42-2, 42-3 and 42-4 provides one of the interleaved clock signals K1, K2, K3, and K4, respectively, and is connected to the respective one of the clock outputs 14-1, 14-2, 14-3 and 14-4. The data output of each of the delay stages 42-1, 42-2 and 42-3 is additionally connected to the data input D of the delay stages 42-2, 42-3 and 42-4, respectively. The data input D of the delay stage 42-1 is connected to the input clock input 12.

Each of the delay stages 42-1 to 42-4 outputs a signal received at its data input with a time delay substantially equal to the desired time delay Td. As will be described in more detail below, the four-stage serial-delay circuit 40 typically additionally includes a Delay Locked Loop (DLL) or a Phase Locked Loop (PLL) that controls the time delay of the delay stages to make the time delay equal the desired time delay Td. The open-loop embodiment shown in FIG. 3A is suitable for use in some applications in which the relative timing of the interleaved clock signals is less critical.

FIG. 3B shows waveforms of the input clock signal K0 and of the interleaved clock signals K1, K2, K3 and K4 in an example of a conventional ring counter based exclusively on the multi-stage serial delay circuit 40. The interleaved clock signals K1–K4 are output by the delay stages 42-1 to 42-4, respectively. Each of the interleaved clock signals K1–K4 has the same period as the input clock signal K0. The interleaved clock signal generated by the delay stage n is incrementally delayed relative to the interleaved clock signal generated by the delay stage n−1 by the time delay of the delay stage n. The time delays imposed by the delay stages 42-1, 42-2, 42-3 and 42-4 are indicated by Td1, Td2, Td3 and Td4, respectively. For example, the positive-going edge 51 of the interleaved clock signal K3 generated by the delay stage 42-3 is incrementally delayed relative to the positive-going edge 52 of the interleaved clock signal K2 generated by the delay stage 42-2 by the time delay Td3 of the delay stage 42-3.

The multi-stage serial-delay circuit 40 has a number of advantages. The minimum delay time of the delay stages 42-1 to 42-4 determines the minimum time delay Td. Moreover, the period of the input clock signal K0 and of the signals at any location in the multi-stage serial-delay circuit is about N×Td. Thus, the maximum frequency in the multi-stage serial-delay circuit is about the same as the frequency of the interleaved clock signals K1–KN. This substantially simplifies the frequency aspects of the circuit design compared with those of a ring counter-based interleaved clock generator configured to generate interleaved clock signals of the same frequency.

However, the multi-stage serial-delay circuit 40 suffers from the significant disadvantage that the input clock signal K0 must propagate through an average of N/2 delay stages, and a maximum of N delay stages, to reach the clock outputs 14-1 to 14-4. This can cause large timing errors and jitter, especially when N is large.

The number of delay stages through which the edges of the input clock signal propagate may be halved by halving the number of delay stages, using differential delay stages as the delay stages and using differential clock signals having a 50% duty cycle as the input clock signal K0. Then, the normal clock signals generated by the N/2 delay stages provide interleaved clock signals 1 to N/2, and the inverted interleaved clock signals generated by the N/2 delay stages provide interleaved clock signals ((N/2)+1) to N. This measure reduces the number of delay stages through which the input clock signal propagates by a factor of 2, but may still result in unacceptably-large timing errors and jitter.

Accordingly, what is needed is an interleaved clock generator that can generate a large number of interleaved clock signals that have the small timing errors and low jitter of interleaved clock signals generated by a ring counter but that are temporarily separated by a delay time that is less than that which can conveniently be provided by a ring counter. In other words, what is needed is an interleaved clock generator that can generate a large number of interleaved clock signals and that has an input clock signal requirement similar to that of a multi-stage serial-delay circuit but that does not suffer from the large timing errors and jitter that typically result from using a multi-stage serial-delay circuit to generate a large number of interleaved clock signals.

SUMMARY OF THE INVENTION

In one aspect, the invention provides an interleaved clock generator that generates N interleaved clock signals in response to an input clock signal, where N is a non-prime integer. The interleaved clock generator comprises an interleaved clock generator of a first type for receiving the input clock signal and for generating M interleaved intermediate clock signals in response to the input clock signal, where M is a factor of N and is an integer greater than unity. The interleaved clock generator of the first type includes either a multi-stage serial-delay circuit or a ring counter circuit. The interleaved clock generator additionally comprises M interleaved clock generators of a second type, each of which is each for receiving a respective one of the intermediate clock signals from the clock generator of the first type and for generating N/M of the N interleaved clock signals in response to the respective one of the intermediate clock signals. Each of the interleaved clock generators of the second type includes either a ring counter circuit or a multi-stage serial-delay circuit: a ring counter when the interleaved clock generator of the first type includes a multi-stage serial-delay circuit; a multi-stage serial-delay circuit when the interleaved clock generator of the first type includes a ring counter circuit. In the clock generator, corresponding edges of temporally-adjacent ones of the interleaved clock signals differ in time by a time delay Td; the interleaved clock signals have a frequency of 1/(N*Td); the input clock signal has a frequency of 1/(M*Td) when the interleaved clock generator of the first type includes the multi-stage serial delay circuit; and the input clock signal has a frequency of M/(N*Td) when the interleaved clock generator of the first type includes the ring counter circuit.

In another aspect, the invention provides an interleaved clock generator for generating N interleaved clock signals in response to an input clock signal, where N is a non-prime integer. The interleaved clock generator comprises an interleaved clock generator of a first type for receiving the input clock signal and for generating in response thereto M interleaved intermediate clock signals, where M is a factor of N and is an integer greater than unity. The interleaved clock generator means of the first type includes a multi-stage serial-delay circuit. The interleaved clock generator also comprises M interleaved clock generators of a second type, each for receiving a respective one of the intermediate clock signals from the clock generator means of the first type and for generating in response thereto N/M of the N interleaved clock signals. Each of the interleaved clock generator means of the second type includes a ring counter circuit. In the interleaved clock generator, the input clock signal comprises differential clock signals each having a 50% duty cycle; and the multi-stage serial-delay circuit includes M/2 delay stages, each providing two of the intermediate clock signals.

In another aspect the invention provides an interleaved clock generator for generating N interleaved clock signals in response to an input clock signal, where N is a non-prime integer. The interleaved clock generator comprises an interleaved clock generator of a first type for receiving the input clock signal and for generating in response thereto M interleaved intermediate clock signals, where M is a factor of N and is an integer greater than unity. The interleaved clock generator of the first type includes a ring counter circuit. The interleaved clock generator additionally comprises M interleaved clock generators of a second type, each for receiving a respective one of the intermediate clock signals from the clock generator of the first type and for generating in response thereto N/M of the N interleaved clock signals. Each of the interleaved clock signal generators of the second type includes a multi-stage serial-delay circuit.

In another aspect, the invention also provides an interleaved clock generator that generates N interleaved clock signals in response to an input clock signal, where N is a non-prime integer. The interleaved clock generator comprises an interleaved clock generator of a first type and M interleaved clock generators of a second type, where M is a factor of N and is an integer greater than unity. The interleaved clock generator of the first type includes a clock input connected to receive the input clock signal, M intermediate clock outputs and either a multi-stage serial-delay circuit or a ring counter circuit. The interleaved clock generator of the first type operates in response to the input clock signal to output a respective intermediate clock signal at each of the intermediate clock outputs.

Each of the M interleaved clock generators of the second type includes an intermediate clock input connected to a different one of the M intermediate clock outputs of the interleaved clock signal generator of the first type, N/M clock outputs and either a ring counter circuit or a multi-stage serial-delay circuit. The interleaved clock signal generator of the second type includes a ring counter in an embodiment in which the interleaved clock generator of the first type includes a multi-stage serial-delay circuit, and includes a multi-stage serial-delay circuit in an embodiment in which the interleaved clock generator of the first type includes a ring counter circuit. Each of the interleaved clock generators of the second type operates in response to the intermediate clock signal to output a respective one of N/M of the interleaved clock signals at each of the clock outputs. In the clock generator, corresponding edges of temporally adjacent ones of the interleaved clock signals differ in time by a time delay Td; the interleaved clock signals have a frequency of 1/(N×Td); the input clock signal has a frequency of 1/(M×td) when the interleaved clock generator of the first type includes the multi-stage serial delay circuit; and the input clock signal has a frequency of M/(N×td) when the interleaved clock generator of the first type includes the ring counter circuit.

In another aspect, the invention provides an interleaved clock generator for generating N interleaved clock signals in response to an input clock signal, where N is a non-prime integer. The interleaved clock generator comprises an interleaved clock generator of a first type, including a clock input connected to receive the input clock signal, M intermediate clock outputs, where M is a factor of N and is an integer greater than unity, and a ring counter circuit. The interleaved clock generator of the first type operates in response to the input clock signal to output a respective intermediate clock signal at each of the intermediate clock outputs. The interleaved clock generator additionally comprises M interleaved clock generators of a second type, each including an intermediate clock input connected to a different one of the M intermediate clock outputs of the interleaved clock signal generator of the first type, N/M clock outputs and a multi-stage serial-delay circuit. Each of the interleaved clock generators of the second type operates in response to the intermediate clock signal to output a respective one of N/M of the interleaved clock signals at each of the clock outputs multi-stage serial-delay circuit.

In another aspect, the invention provides an interleaved clock generator for generating N interleaved clock signals in response to an input clock signal, where N is a non-prime integer. The interleaved clock generator comprises a multi-stage serial-delay circuit connected to receive the input clock signal, the multi-stage serial-delay circuit including M intermediate clock outputs where M is a factor of N and is an integer greater than unity; and connected to each of the M intermediate clock outputs, a ring counter circuit that generates N/M of the N interleaved clock signals. In the interleaved clock generator, corresponding edges of temporally-adjacent ones of the interleaved clock signals differ in time by a time delay Td; the interleaved clock signals have a frequency of 1/(N*Td); and the input clock signal has a frequency of 1/(M*Td).

Finally, the invention provides an interleaved clock generator that generates N interleaved clock signals in response to an input clock signal, where N is a non-prime integer. The interleaved clock generator comprises a multi-stage serial-delay circuit. The multi-stage serial-delay circuit is connected to receive the input clock signal and includes M intermediate clock outputs, where M is a factor of N and is an integer greater than unity. The interleaved clock generator additionally comprises a ring counter circuit connected each of the M intermediate clock outputs. The ring counter circuit generates N/M of the N interleaved clock signals. In the interleaved clock generator, corresponding edges of temporally-adjacent ones of the interleaved clock signals differ in time by a time delay Td; the interleaved clock signals have a frequency of 1/(N*Td); and the input clock signal has a frequency of 1/(M*Td).

The interleaved clock signal generator of the invention provides a substantial reduction in the frequency of the input clock signal compared with a conventional interleaved clock generator based exclusively on a ring counter. For example, when corresponding edges of temporally-adjacent ones of the interleaved clock signals differ in time by a time delay Td, the interleaved clock signals have a frequency of 1/(N*Td). The input clock signal has a frequency of 1/(M*Td) when the interleaved clock generator of the first type includes the multi-stage serial delay circuit and a frequency of M/(N*Td) when the interleaved clock generator of the first type includes the ring counter circuit.

The interleaved clock signal generator of the invention also provides a substantial number in the maximum number of stages through which the input clock signal passes between the input clock signal input and the intermediate clock signal outputs compared with a conventional interleaved clock generator based exclusively on a multi-stage serial-delay circuit. These characteristics enable the interleaved clock generator according to the invention to generate one or more of: more interleaved clock signals, interleaved clock signals with a smaller time delay Td, and interleaved clock signals with smaller timing errors and less jitter.

DETAILED DESCRIPTION OF THE INVENTION

Figure 4:
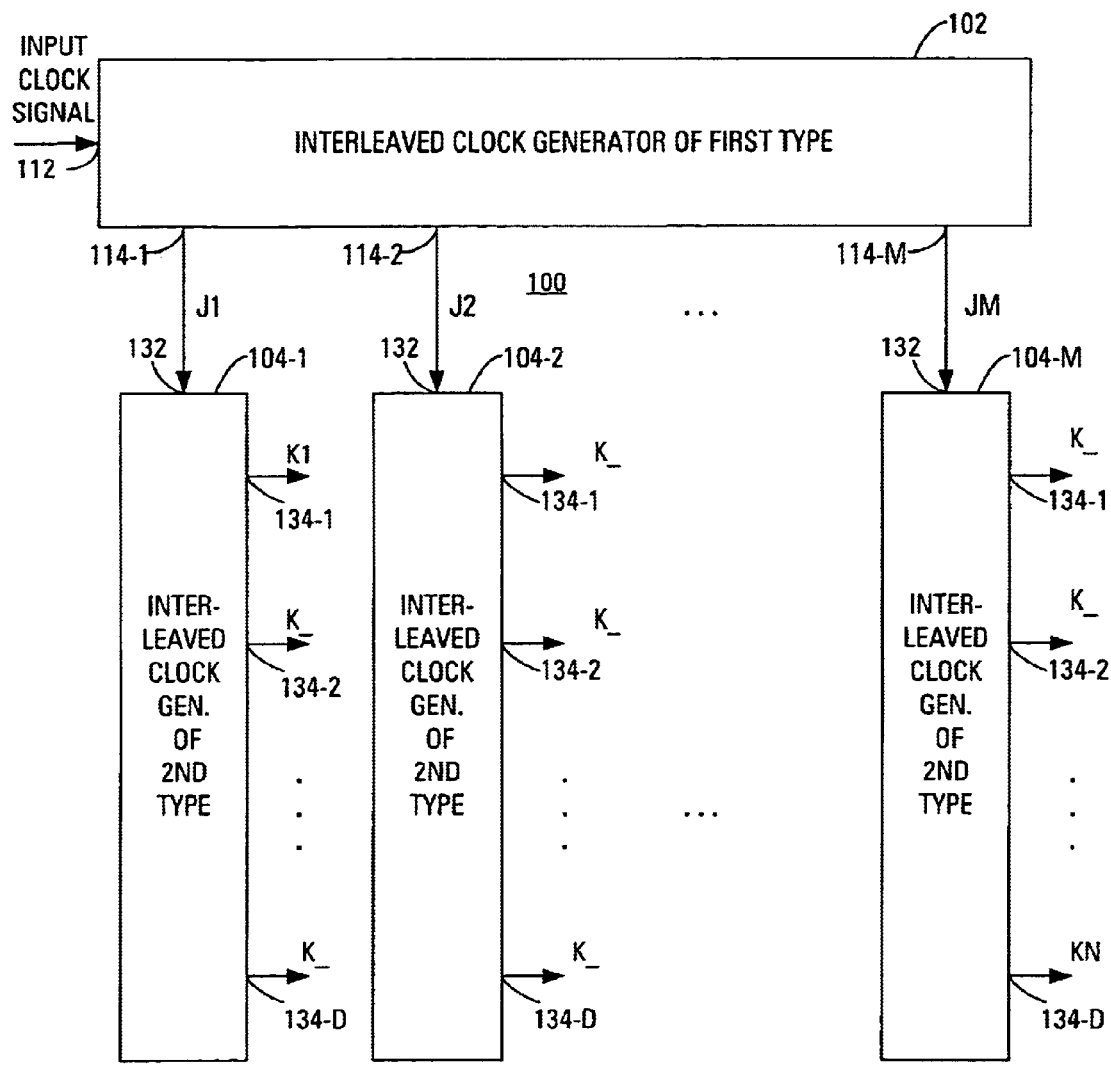
FIG. 4 is a block diagram showing an example of a interleaved clock generator according to the invention.

FIG. 4 is a block diagram of an embodiment 100 of an interleaved clock generator according to the invention. The example shown generates N interleaved clock signals K1–KN in response to the input clock signal K0. Corresponding edges of temporally adjacent ones of the interleaved clock signals differ in time by a time delay Td and the interleaved clock signals have a frequency of 1/(N×Td).

Figure 1A:
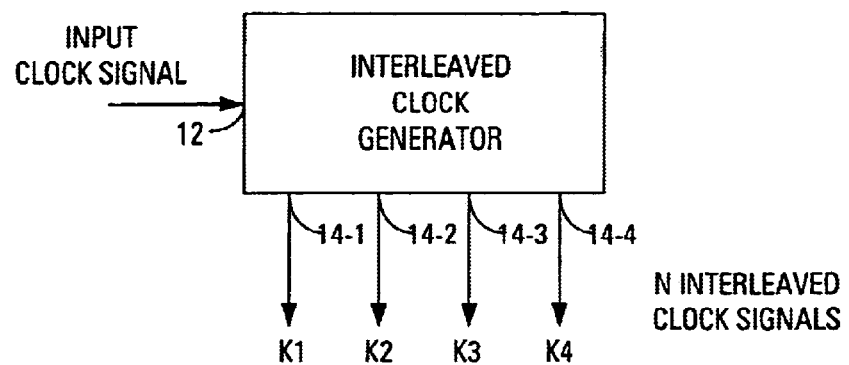
FIG. 1A is a block diagram showing an example of an interleaved clock generator.
Figure 1B:
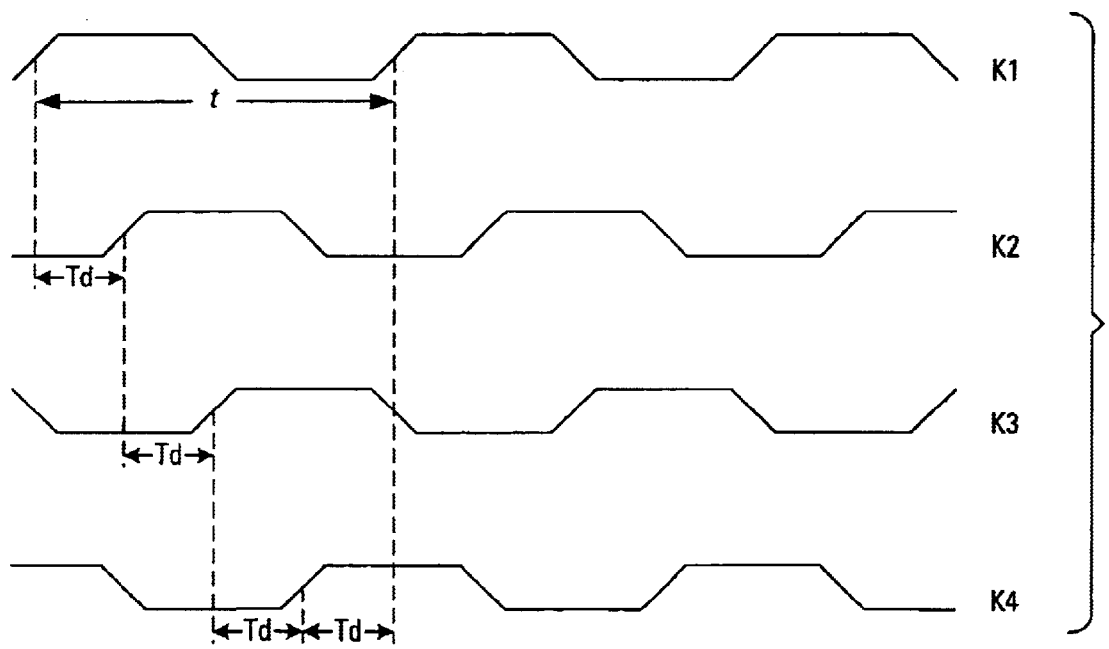
FIG. 1B is a set of graphs showing the waveforms of the interleaved clock signals K1, K2, K3 and K4 generated by the interleaved clock generator shown in FIG. 1A.
Figure 2A:
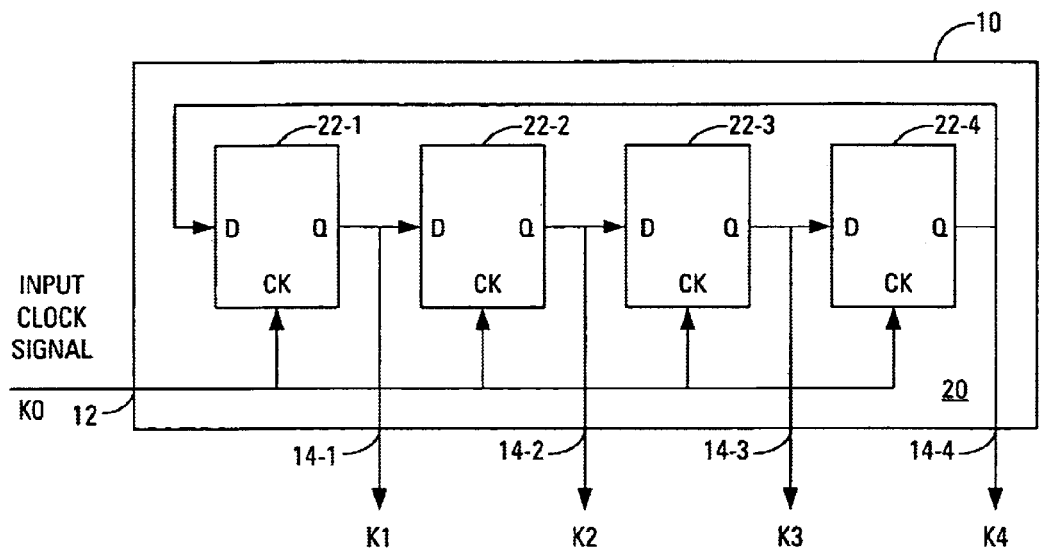
FIG. 2A is a block diagram showing an example of a conventional interleaved clock generator based exclusively on a ring counter.
Figure 2B:
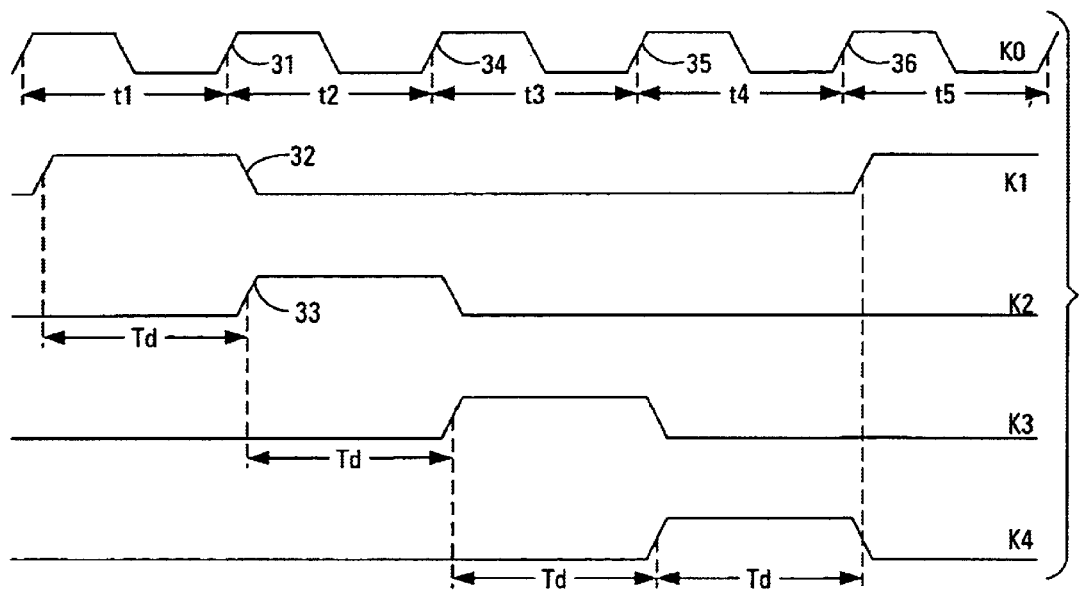
FIG. 2B is a set of graphs showing the waveforms of the input clock signal K0 and the interleaved clock signals K1, K2, K3 and K4 generated by the conventional interleaved clock generator shown in FIG. 2A.
Figure 3A:
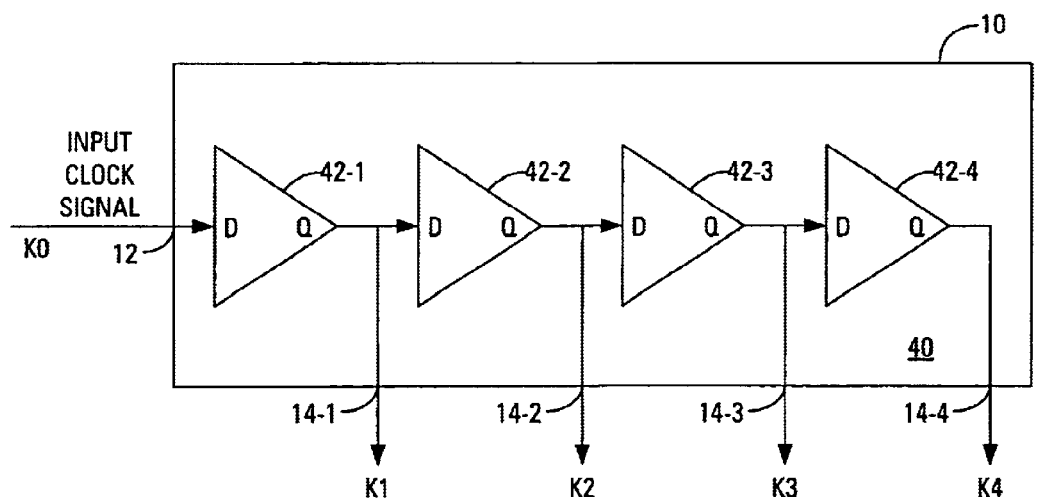
FIG. 3A is a block diagram showing an example of a conventional interleaved clock generator based exclusively on a multi-stage serial-delay circuit.
Figure 3B:
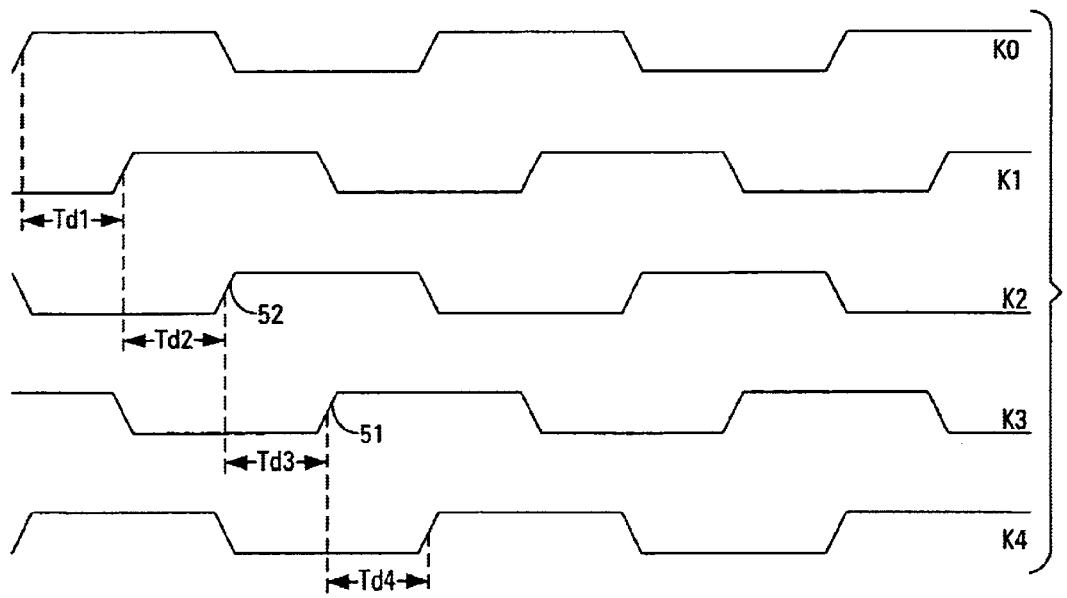
FIG. 3B is a set of graphs showing the waveforms of the input clock signal K0 and the interleaved clock signals K1, K2, K3 and K4 generated by the conventional interleaved clock generator shown in FIG. 3A.

The interleaved clock generator 100 is composed of the interleaved clock generator of a first type 102 and the M interleaved clock generators of a second type 104-1, 104-2, ..., 104-M. The interleaved clock generator of the first type 102 includes the input clock input 112 and the M intermediate clock outputs 114-1, 114-2, ..., 114-M. The interleaved clock generator of the first type is either a multi-stage serial-delay circuit similar to the multi-stage serial-delay circuit 40 described above with reference to FIG. 3A, or is a ring counter circuit, an example of which is the ring counter 20 described above with reference to FIG. 2A. Each stage of the multi-stage serial-delay circuit has a time delay equal to the time delay Td.

The interleaved clock generator of the first type operates in response to the input clock signal K0 to output the M intermediate clock signals J1, J2, ..., JM at the intermediate clock outputs 114-1, 114-2, ..., 114-M, respectively. The interleaved clock generator of the first type can alternatively be described in functional terms as receiving the input clock signal K0 and generating in response to the input clock signal the M interleaved intermediate clock signals J1–JM.

Each of the M interleaved clock generators of the second type 104-1 to 104-M includes an intermediate clock input 132 and the D clock outputs 134-1, 134-2, ..., 134-D, where D=N/M. The intermediate clock input of each interleaved clock generator of the second type is connected to a different one of the M intermediate clock outputs of the interleaved clock signal generator of the first type 102. In other words, the intermediate clock inputs 132 of the interleaved clock generators of the second type 104-1 to 104-M are connected to the intermediate clock outputs 114-1 to 114-M, respectively, of the interleaved clock generator of a first type 102.

In an embodiment of the interleaved clock generator 100 in which the interleaved clock generator of the first type 102 is a multi-stage serial-delay circuit, each of the interleaved clock generators of the second type 104-1 to 104-M is a ring counter circuit, an example of which is the ring counter 20 described above with reference to FIG. 2A. In an embodiment of the interleaved clock generator 100 in which the interleaved clock generator of the first type is a ring counter circuit, each of the interleaved clock generators of the second type is a multi-stage serial-delay circuit similar to the multi-stage serial-delay circuit 40 described above with reference to FIG. 3A.

Each of the interleaved clock generators of the second type 104-1 to 104-M operates in response to a respective one of the intermediate clock signal J1 to JM to output a respective one of D (=N/M) of the interleaved clock signals at each of the D clock outputs 134-1, 134-2, . . . , 134-D. Each of the interleaved clock generators of the second type can alternatively be described in functional terms as receiving a respective one of the intermediate clock signals from the interleaved clock generator of the first type 102 and generating in response to the intermediate clock signal D (=N/M) of the N interleaved clock signals.

For example, the interleaved clock generator of the second type 104-1 operates in response to the intermediate clock signal J1 to output a respective one of D interleaved clock signals at each of the D clock outputs 134-1 to 134-D. Alternatively, the interleaved clock generator of the second type 104-1 can be described functionally as receiving a respective one of the intermediate clock signals from the interleaved clock generator of the first type 102 and generating in response to the intermediate clock signal J1 D of the N interleaved clock signals K1–KN.

In an embodiment of the interleaved clock generator 100 in which the interleaved clock generator of the first type 102 includes a multi-stage serial-delay circuit and each of the interleaved clock generators of the second type 104-1 to 104-M includes a ring counter circuit, the interleaved clock generators of the second type output the interleaved clock signals K1–KN in the row-wise arrangement shown in Table 1.

TABLE 1

| | Int clock gen of 2$^{nd}$ type | | | |
|---|---|---|---|---|
| clock output | 104-1 | 104-2 | . . . | 104-M |
| 134-1 | K1 | K2 | . . . | KM |
| 134-2 | K(M + 1) | K(M + 2) | . . . | K(2M) |
| . . . | . . . | . . . | . . . | . . . |
| 134-D | K(((D − 1) * M) + 1 | K(((D − 1) * M) + 2 | . . . | KN |

In an embodiment of the interleaved clock generator 100 in which the interleaved clock generator of the first type 102 includes a ring counter circuit and each of the interleaved clock generators of the second type 104-1 to 104-M includes a multi-stage serial-delay circuit, the interleaved clock generators of the second type output the interleaved clock signals K1–KN in the column-wise arrangement shown in Table 2.

TABLE 2

| | Int clock gen of 2$^{nd}$ type | | | |
|---|---|---|---|---|
| clock output | 104-1 | 104-2 | . . . | 104-M |
| 134-1 | K1 | K(D + 1) | . . . | K(((M − 1) * D) + 1) |
| 134-2 | K2 | K(D + 2) | . . . | K(((M − 1) * D) + 2) |
| . . . | . . . | . . . | . . . | . . . |
| 134-D | KD | K(2D) | | KN |

In an embodiment of the interleaved clock generator 100 configured to generate N interleaved clock signals with a delay time of Td, the frequency of the input clock signal K0 is less than that of the input clock signal of a conventional interleaved clock generator based exclusively on a ring counter circuit and configured to generate N interleaved clock signals with a time delay of Td. As will be described in more detail below with reference to FIGS. 5A–5C and 7A–7C, the reduction in the frequency of the input clock signal depends on the configuration of the interleaved clock generator 100, unless the configuration is a square configuration in which D=M=(N)$^{1/2}$. In the case of the square configuration, the frequency of the input clock signal is 1/M of that of the input clock signal of a conventional interleaved clock generator based exclusively on a ring counter circuit.

In an embodiment of the interleaved clock signal generator 100 in which the interleaved clock generator of the first type 102 includes a multi-stage serial-delay circuit and each of the interleaved clock generators of the second type 104-1 to 104-M includes a ring counter circuit, the frequency of the intermediate clock signals is D times that of the interleaved clock signals, and the frequency of the input clock signal is equal to that of the intermediate clock signals. Thus, the frequency of the input clock is D times that of the interleaved clock signals, i.e., D/(N×Td)=1/(M×Td).

In a conventional interleaved clock generator based exclusively on a ring counter circuit, the frequency of the input clock signal is N times that of the interleaved clock signals, i.e., N/(N×Td)=1/Td. Thus, in an embodiment of the interleaved clock generator 100 in which the interleaved clock generator of the first type 102 includes a multi-stage serial-delay circuit, the frequency of the input clock signal is (1/(M×Td))/(1/Td)=1/M that of the input clock signal of a conventional interleaved clock generator based exclusively on a ring counter circuit.

In an embodiment of the interleaved clock signal generator 100 in which the interleaved clock generator of the first type 102 includes a ring counter circuit and each of the interleaved clock generators of the second type 104-1 to 104-M includes a multi-stage serial-delay circuit, the frequency of the intermediate clock signals is equal to that of the interleaved clock signals, and the frequency of the input clock signal is M times that of the intermediate clock signals. Thus, the frequency of the input clock is M times that of the interleaved clock signals, i.e., M/(N×Td)=1/(D×Td). Thus, in an embodiment of the interleaved clock generator 100 in which the interleaved clock generator of the first type 102 includes a ring counter circuit, the frequency of the input clock signal is (1/(D×Td))/(1/Td)=1/D of that of the input clock signal of a conventional interleaved clock generator based exclusively on a ring counter circuit.

Thus, regardless of the circuit used as the interleaved clock generator of the first type in the interleaved clock generator 100, the frequency of the input clock signal is substantially lower than that of a conventional interleaved clock generator based exclusively on a ring counter circuit. Alternatively, for a given frequency of the input clock signal, interleaved clock generator 100 can generate more interleaved clock signals, or can generate the interleaved clock signals with a decreased time delay between corresponding edges of adjacent ones of them, or can generate more interleaved clock signals with a reduced time delay compared with the above-mentioned conventional interleaved clock generator.

In an embodiment of the interleaved clock generator 100 configured to generate N interleaved clock signals, the number of stages through which the input clock signal passes between the input clock input and the clock outputs is less than that in a conventional interleaved clock generator based exclusively on a multi-stage serial-delay circuit and configured to generate N interleaved clock signals. The reduction in the maximum number of stages depends on the configuration of the interleaved clock generator 100, unless the configuration is a square configuration in which $D=M=(N)^{1/2}$. In the case of a square configuration, the maximum number is stages is reduced from N to (M+1).

In an embodiment of the interleaved clock signal generator 100 in which the interleaved clock generator of the first type 102 includes a multi-stage serial-delay circuit and each of the interleaved clock generators of the second type 104-1 to 104-M includes a ring counter circuit, the intermediate clock signals pass through one stage to the clock outputs, and the input clock signal passes through a maximum of M stages to the intermediate clock signal outputs. In a conventional interleaved clock generator based exclusively on a multi-stage serial delay circuit, the maximum number of stages through which the input clock signal passes is N. Thus, in an embodiment of the interleaved clock generator 100 in which the interleaved clock generator of the first type 102 includes a multi-stage serial-delay circuit, the maximum number of stages through which the input clock signal passes is (M+1)/N of that in a conventional interleaved clock generator based exclusively on a multi-stage serial delay circuit.

In an embodiment of the interleaved clock signal generator 100 in which the interleaved clock generator of the first type 102 includes a ring counter circuit and each of the interleaved clock generators of the second type 104-1, 104-2, . . . , 104-M includes a multi-stage serial-delay circuit, the intermediate clock signals pass through a maximum of D stages to the clock outputs, and the input clock signal passes through one stage to the intermediate clock outputs. Thus, in an embodiment of the interleaved clock generator 100 in which the interleaved clock generator of the first type 102 includes a ring counter circuit, the maximum number of stages through which the input clock signal passes is (D+1)/N of that in a conventional interleaved clock generator based exclusively on a multi-stage serial-delay circuit.

Thus, regardless of the configuration of the interleaved clock generator 100, the maximum number of stages through which the input clock signal passes to the clock outputs is substantially less than that of a conventional interleaved clock generator based exclusively on a multi-stage serial-delay circuit. Hence, timing errors and jitter are substantially lower. Alternatively, for a given level of timing errors and jitter, the interleaved clock generator 100 can generate substantially more interleaved clock signals than the above-mentioned conventional interleaved clock generator.

When the number of the interleaved clock signals N generated by the interleaved clock generator has more than one pair of factors, e.g., N=32=2×16=4×8=8×4=16×2, the configuration of the interleaved clock generator 100, i.e., the values of D and M and the type of circuit used as the interleaved clock generator 102 and the interleaved clock generators 104-1 to 104-M, can be chosen to provide an optimum compromise between the frequency of the input clock signal on one hand and low timing errors and low jitter on the other. Simply reducing the frequency of the input clock signal by a factor of two may be sufficient to reduce the input clock frequency to one that can be easily generated and propagated in the chosen fabrication technology.

Some practical examples of the interleaved clock generator 100 will now be described with reference to FIGS. 5A–5C, 6A, 6B and 7A–7C. In each of the examples, the interleaved clock generator is configured to generate 12 interleaved clock signals, i.e., N=12. Practical embodiments of the interleaved clock generator 100 typically generate more than 12 interleaved clock signals. However, examples in which N=12, M=4 and D=3 or N=12, M=3 and D=4 are adequately illustrative without being overly-complex. It will be apparent to a person of ordinary skill in the art that the examples can easily be modified to generate any other non-prime number of interleaved clock signals.

Figure 5A:
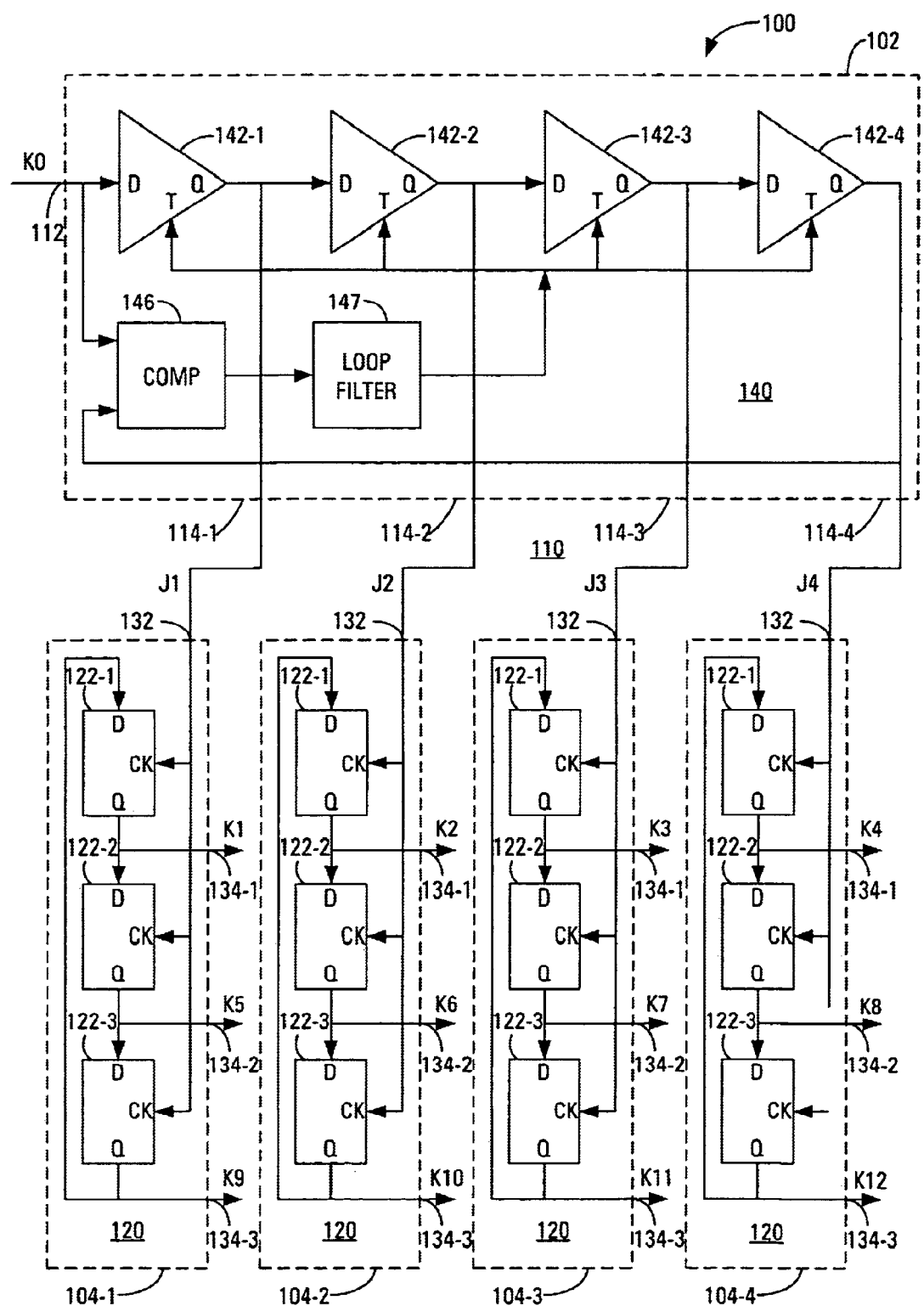
FIG. 5A is a block diagram of a first practical example of an interleaved clock generator according to the invention. In this example, the interleaved clock generator of the first type includes a multi-stage serial-delay circuit, M=4 and D=3.

FIG. 5A is a block diagram of a first practical example 110 of the interleaved clock generator 100 according to the invention in which M=4 and D=3. The interleaved clock generator 110 is composed of the interleaved clock generator of the first type 102 and the four interleaved clock signal generators of the second type 104-1, 104-2, 104-3 and 104-4. The intermediate clock inputs 132 of the interleaved clock signal generators of the second type 104-1, 104-2, 104-3 and 104-4 are connected to the intermediate clock outputs 114-1, 114-2, 114-3 and 114-4, respectively, of the interleaved clock generator of the first type 102.

The interleaved clock generator of the first type 102 is composed of a multi-stage serial-delay circuit, specifically, the four-stage serial-delay circuit 140. The four-stage serial-delay circuit is composed of the delay stages 142-1, 142-2, 142-3 and 142-4, each of which includes a data input D, a data output Q and a tuning input T. The data input of the delay stage 142-1 is connected to the input clock input 112. The data inputs of the delay stages 142-2, 142-3 and 142-4 are connected to the data outputs of the delay stages 142-1, 142-2 and 142-3, respectively. The data outputs of the delay stages 142-1, 142-2, 142-3 and 142-4 are also connected to the intermediate clock outputs 114-1, 114-2, 114-3 and 114-4, respectively. Since M=4, this embodiment generates the four intermediate clock signals J1, J2, J3 and J4.

Each of the interleaved clock signal generators of the second type 104-1, 104-2, 104-3 and 104-4 is composed of a ring counter circuit, specifically, the three-stage ring counter circuit 120. The three-stage ring counter circuit is composed of the stages 122-1, 122-2 and 122-3 interconnected to form a conventional ring counter. As will be described below with reference to FIGS. 8A–8C, a three-stage shift register, a decoded three-bit counter or some other type of circuit in which states are looped through a number of stages in response to an intermediate clock signal received directly from the intermediate clock input 132 may alternatively be used as the ring counter circuit.

Each of the stages 122-1 to 122-3 includes a data input D, a data output Q and a clock input CK. The data inputs of the stages 122-1, 122-2 and 122-3 are connected to the data outputs of the stages 122-3, 122-1 and 122-2, respectively. The clock inputs of the stages are connected to the intermediate clock input 132. The data outputs of the stages 122-1, 122-2 and 122-3 are additionally connected to the clock outputs 134-1, 134-2 and 134-3.

Each of the stages 122-1 to 122-3 is configured to set the state of its data output Q to a predetermined state when power is applied. For example, each of the stages may additionally include a present input (not shown) connected to a preset line (not shown) that is asserted at power on to set the state of the data output of the stage to the predetermined state. In the three-stage example shown, the predetermined state of one of the stages differs from that of the other two.

The outputs of the stages 122-1, 122-2 and 122-3 of the ring counter circuit 120 constituting the interleaved clock signal generator of the second type 104-1 provide three of the 12 interleaved clock signals, namely, interleaved clock signals K1, K5 and K9, respectively. The outputs of the stages 122-1, 122-2 and 122-3 of the ring counter circuit 120 constituting the interleaved clock signal generator of the second type 104-2 provide a further three of the 12 interleaved clock signals, namely, interleaved clock signals K2, K6 and K10, respectively. The outputs of the stages 122-1, 122-2 and 122-3 of the ring counter circuit 120 constituting the interleaved clock signal generator of the second type 104-3 provide a further three of the 12 interleaved clock signals, namely, interleaved clock signals K3, K7 and K11. The outputs of the stages 122-1, 122-2 and 122-3 of the ring counter circuit 120 constituting the interleaved clock signal generator of the second type 104-4 provide the final three of the 12 interleaved clock signals, namely, interleaved clock signals K4, K8 and K12.

Figure 5B:
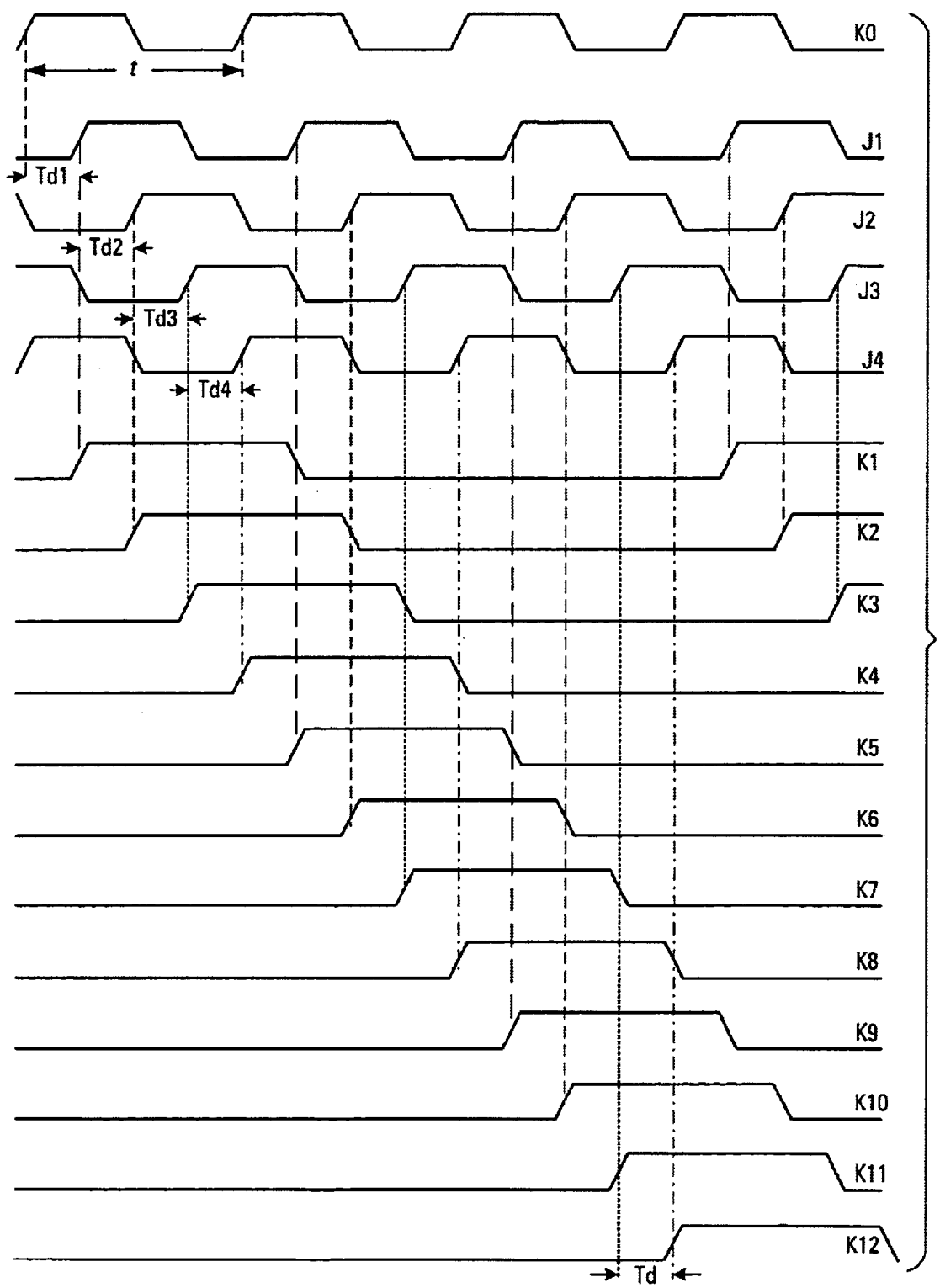
FIG. 5B is a set of graphs illustrating the operation of the interleaved clock generator shown in FIG. 5A.

FIG. 5B is a set of graphs illustrating the operation of the interleaved clock generator 110 shown in FIG. 5A in which N=12, M=4 and N/M=D=3. FIG. 5B shows the waveform of the input clock signal K0 and additionally shows the waveforms of the intermediate clock signals J1–J4 generated by the multi-stage serial-delay circuit 140 constituting the interleaved clock generator of the first type 102. The intermediate clock signals J1–J4 are each equal in frequency to the input clock signal but are progressively delayed in time relative to the input clock signal by the time delays of the delay stages 142-1 to 142-4 constituting the multi-stage serial delay circuit 140. The time delays of the delay stages 142-1, 142-2, 142-3 and 142-4 are indicated as Td1, Td2, Td3 and Td4, respectively, and are each equal to one quarter of the period t of the input clock signal, and to the desired time delay Td.

FIG. 5B also shows the waveforms of the interleaved clock signals K1–K12. Each of the interleaved clock signals is progressively shifted in time relative to the previous interleaved clock signal by the desired time delay Td. The frequency of each of the interleaved clock signals is one-third of that of the intermediate clock signals and the input clock signal. Thus, the frequency of the input clock signal is only three times that of the interleaved clock signals even though the interleaved clock generator 100 generates 12 interleaved clock signals.

In FIG. 5B, a broken line connects the positive-going edge of each of the interleaved clock signals K1–K12 to the positive-going edge of the one of the intermediate clock signal J1–J4 in response to which the interleaved clock signal is generated by the respective one of the interleaved clock signal generators of the second type 104-1 to 104-4. For example, broken lines connect the positive-going edges of the interleaved clock signals K3, K7 and K10 to the positive-going edges of the intermediate clock signal J3 in response to which these interleaved clock signals are generated by the interleaved clock signal generator of the second type 104-3.

Figure 5C:
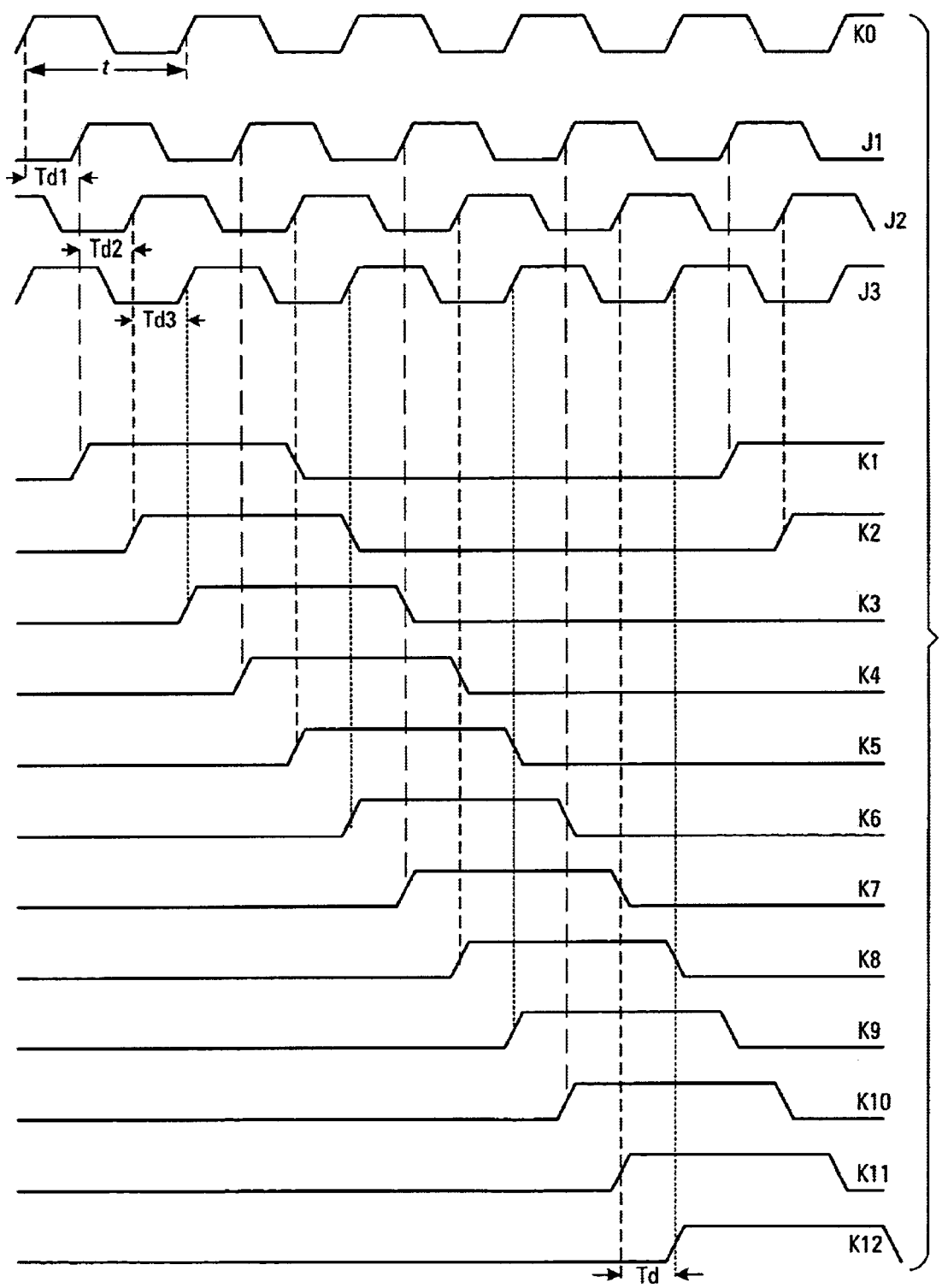
FIG. 5C is a set of graphs illustrating the operation of a variation on the interleaved clock generator shown in FIG. 5A in which M=3 and D=4.

FIG. 5C is a set of graphs illustrating the operation of a variation (not shown) of the interleaved clock generator 110 shown in FIG. 5A. In the variation, the interleaved clock generator of the first type is composed of a three-stage serial-delay circuit and each of three interleaved clock generators of the second type is composed of a four-stage ring counter circuit. In other words, N=12, M=3 and D=4 in this variation. FIG. 5C shows the waveform of the input clock signal K0 and additionally shows the waveforms of the three intermediate clock signals J1–J3 generated by the three-stage serial-delay circuit constituting the interleaved clock generator of the first type. The intermediate clock signals J1–J3 are each equal in frequency to the input clock signal but are progressively delayed in time relative to the input clock signal by the time delay of the three delay stages constituting the multi-stage serial delay circuit. The time delays of the three delay stages are indicated as Td1, Td2 and Td3, and are each equal to one third of the period t of the input clock signal, and to the desired time delay Td.

FIG. 5C also shows the waveforms of the interleaved clock signals K1–K12. Each of the interleaved clock signals is progressively shifted in time relative to the previous interleaved clock signal by the desired time delay Td. The frequency of each of the interleaved clock signals is one-fourth of that of the intermediate clock signals J1–J3 and of the input clock signal K0. Thus, in this variation, the frequency of the input clock signal is four times that of the interleaved clock signals even though the interleaved clock generator generates 12 interleaved clock signals.

In the variation whose operation is illustrated in FIG. 5C, the frequency of the input clock signal is higher than that of the interleaved clock generator 110 shown in FIG. 5A, and whose operation is illustrated in FIG. 5B. However, the maximum number of stages through which the input clock signal passes between the input clock input 112 and any of the clock outputs 134-1 to 134-D is four. In the interleaved clock generator 110 shown in FIG. 5A, the maximum number of stages through which the input clock signal passes is five.

Returning now to FIG. 5A, the example of the multi-stage serial-delay circuit 140 shown includes an example of a delay-lock loop (DLL) that controls the delay of each of the delay stages 142-1 to 142-4 to make the delay of the delay stage equal to the desired time delay Td. Each of the delay stages is a tuned delay stage that additionally includes the tuning input T. A control signal fed to the tuning input determines the delay time of the tuned delay stage. The DLL additionally includes the comparator 146 and the loop filter 147. The comparator has two inputs, one connected to the input clock input 112, the other connected to the output Q of the delay stage 142-4. The output of the comparator is connected to the input of the loop filter 147. The output of the loop filter is connected to the tuning input T of each of the delay stages 142-1 to 142-4. The DLL controls the delay of the delay stages to synchronize the intermediate clock signal J4 output by the delay stage 142-4 to the input clock signal K0.

Other kinds of delay-lock loops are known in the art and can be used instead of the exemplary DLL shown to control the delay of the tuned delay stages 142-1 to 142-4.

Phase-lock loops (PLL) are also known in the art and can be used instead of the DLL shown to control the delay of the tuned delay stages 142-1 to 142-4.

Figure 6A:
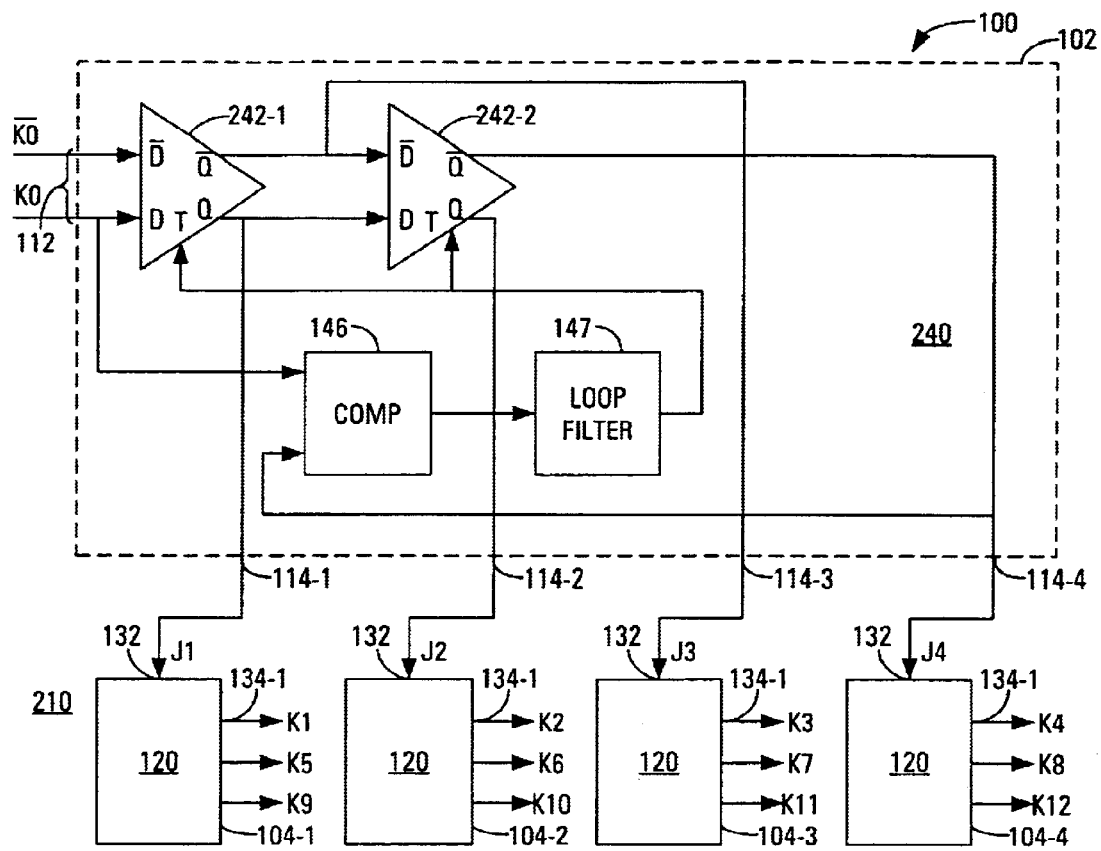
FIG. 6A is a block diagram of a second practical example of an interleaved clock generator according to the invention.

FIG. 6A is a block diagram of a second practical example 210 of an interleaved clock generator 100 according to the invention. Elements of the interleaved clock generator 210 that correspond to elements of the interleaved clock generator 110 described above with reference to FIG. 5A are indicated using the same reference numerals, and will not be described again here. In particular, the interleaved clock signal generators of the second type 104-1 to 104-4 are the same as in the interleaved clock generators of the second type 104-1 to 104-4 shown in FIG. 5A, so structural details of these elements have been omitted from FIG. 6A.

In the interleaved clock generator 210, the interleaved clock generator of the first type 102 includes a multi-stage serial-delay circuit, specifically, the two-stage serial-delay circuit 240. The two-stage serial-delay circuit is composed of the delay stages 242-1 and 242-2. The delay stages 242-1 and 242-2 are differential tuned delay stages that collectively generate the four intermediate clock signals J1, J2, J3 and J4 from the differential input clock signals K0 and K0-bar. Thus, the two-stage serial-delay circuit 240 generates four intermediate clock signals. Consequently, M=4 in this example, even though the multi-stage serial-delay circuit is composed of only two delay stages.

Each of the delay stages 242-1 and 242-2 includes a data input D, an inverse data input D-bar, a data output Q, an inverse data output Q-bar and a tuning input T. The data input D and the inverse data input D-bar of the delay stage 242-1 is are connected to the input clock input 112 to receive the input clock signal K0 and the inverse clock signal K0-bar. The data input D and the inverse data input D-bar of the delay stage 242-2 are connected to the data output Q and the inverse data output Q-bar, respectively, of the delay stage 242-1. The data outputs Q of the delay stages 242-1 and 242-2 are also connected to the intermediate clock outputs 114-1 and 114-2, respectively. The inverse data outputs Q-bar of the delay stages 242-1 and 242-2 are also connected to the intermediate clock outputs 114-3 and 114-4, respectively. The tuning inputs T of the delay stages 242-1 and 242-2 are connected to the output of the loop filter 147.

Figure 6B:
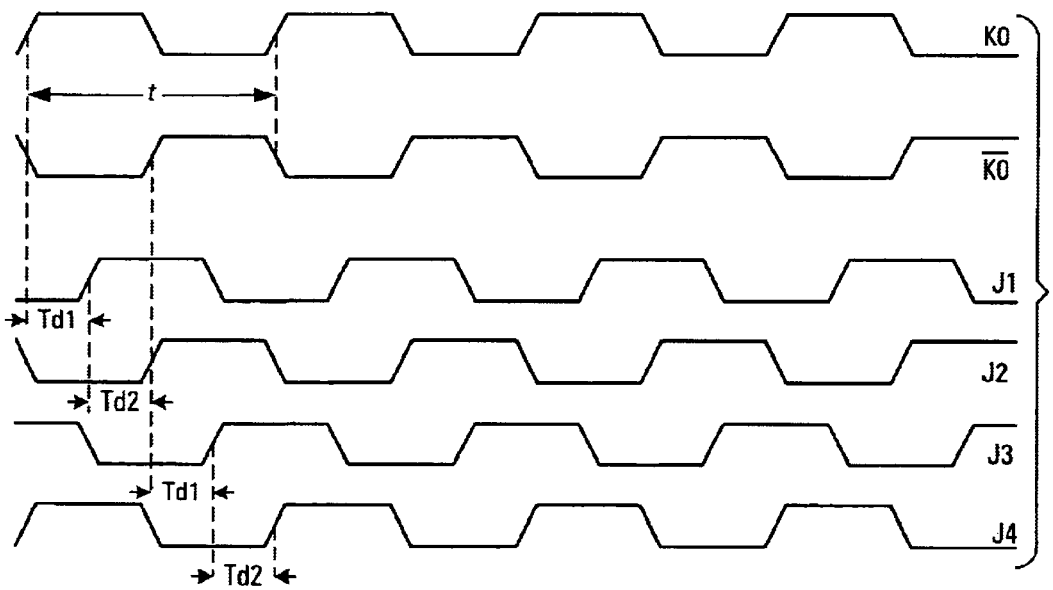
FIG. 6B is a set of graphs illustrating the operation of the multi-stage serial-delay circuit of the interleaved clock generator shown in FIG. 6A.

FIG. 6B is a set of graphs illustrating the operation of the interleaved clock generator 210 shown in FIG. 6A. FIG. 6B shows the waveform of the input clock signal K0 and of the inverse input clock signal K0-bar. The waveform of the inverse input clock signal K0-bar is the inverse of that of the input clock signal K0. Both the input clock signal and the inverse input clock signal have the same frequency, and the same duty cycle, equal to 50%, but the inverse input clock signal K0-bar is shifted in phase by 180° (one half period) relative to the input clock signal K0.

FIG. 6B additionally shows the waveforms of the intermediate clock signals J1–J4 generated by the two-stage serial-delay circuit 240 constituting the interleaved clock generator of the first type 102. The intermediate clock signals J1–J4 are each equal in frequency to the input clock signal. The data output Q of each of the delay stages 242-1 and 242-2 follows changes in the state of the data input D of the respective stage, delayed by a respective time delay Td1 or Td2. The inverse data output Q-bar of each of the delay stages 242-1 and 242-2 follows changes in the state of the inverse data input D-bar of the respective stage, delayed by the respective time delay Td1 or Td2.

The state of the data output Q of the delay stage 242-1 follows the state of the input clock signal K0, delayed by the time delay Td1 of the delay stage 242-1. The data output of the delay stage 242-1 provides the intermediate clock signal J1. The state of the data output Q of the delay stage 242-2 follows the state of the intermediate clock signal J1 output by the delay stage 242-1, delayed by the time delay Td2 of the delay stage 242-2. The data output of the delay stage 242-2 provides the intermediate clock signal J2.

The state of the inverse data output Q-bar of the delay stage 242-1 follows the state of the inverse input clock signal K0-bar, delayed by the time delay Td1 of the delay stage 242-1. The inverse data output of the delay stage 242-1 provides the intermediate clock signal J3. The state of the inverse data output Q-bar of the delay stage 242-2 follows the state of the intermediate clock signal J3 output by the delay stage 242-1, delayed by the time delay Td2 of the delay stage 242-2. The inverse data output of the delay stage 242-2 provides the intermediate clock signal J4.

The time delays of the delay stages 242-1 and 242-2 are equal to one another and equal to one-quarter of the period of the input clock signal K0 and the inverse clock signal K0-bar. Thus, the intermediate clock signals J1 and J2 are delayed one quarter period and two quarter periods, respectively, relative to the input clock signal K0. The intermediate clock signals J3 and J4 are delayed one quarter period and two quarter periods, respectively, relative to the inverse input clock signal K0-bar. Since the inverse clock signal K0-bar is the inverse of the clock signal K0, and can thus be regarded as being delayed two quarter periods relative to the input clock signal K0, the intermediate clock signals J3 and J4 are delayed three quarter periods and four quarter periods, respectively, relative to the input clock signal K0. Thus, the intermediate clock signals J1–J4 are equally temporally delayed within the periods of the intermediate clock signals.

Comparing FIG. 6B with FIG. 5B shows that the four-stage serial-delay circuit 140 shown in FIG. 5A and the two-stage serial-delay circuit 240 shown in FIG. 6A generate the intermediate clock signals J1–J4 with the same delays relative to the input clock signal K0. However, in the two-stage serial-delay circuit 240, the input clock signal passes through fewer independent delay stages than in the four-stage serial-delay circuit 140. Consequently, the intermediate clock signals J1–J4 are subject to fewer and smaller timing errors in the interleaved clock generator 210.

Figure 7A:
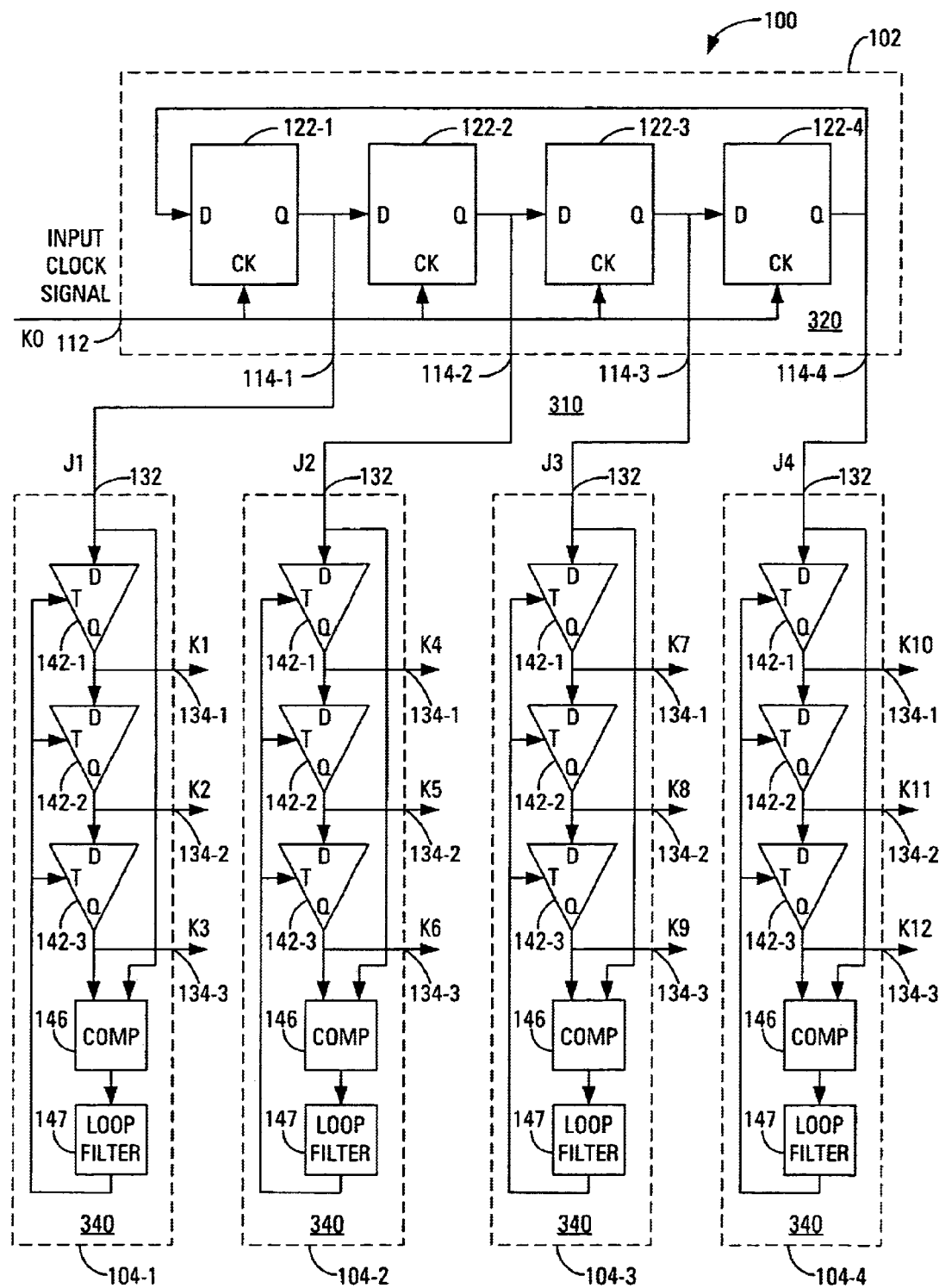
FIG. 7A is a block diagram of a third practical example of an interleaved clock generator according to the invention. In this example, the interleaved clock generator of the first type includes a ring counter circuit, M=4 and D=3.

FIG. 7A is a block diagram of a third practical example 310 of the interleaved clock generator 100 according to the invention in which M=4 and D=3. The interleaved clock generator 310 is composed of the interleaved clock generator of the first type 102 and the four interleaved clock signal generators of the second type 104-1, 104-2, 104-3 and 104-4. The intermediate clock inputs 132 of the interleaved clock signal generators of the second type 104-1, 104-2, 104-3 and 104-4 are connected to the intermediate clock outputs 114-1, 114-2, 114-3 and 114-4, respectively, of the interleaved clock generator of the first type 102.

The interleaved clock generator of the first type 102 includes a ring counter circuit, specifically, the four-stage ring counter circuit 320. The four-stage ring counter circuit is identical to the four-stage ring counter 20 described above with reference to FIG. 2A, and will not be described further. The data outputs of the stages 122-1, 122-2, 122-3 and 122-4 are connected to the intermediate clock outputs 114-1, 114-2, 114-3 and 114-4 respectively. Since M=4, this embodiment generates the four intermediate clock signals J1, J2, J3 and J4.

Each of the interleaved clock signal generators of the second type 104-1, 104-2, 104-3 and 104-4 includes a multi-stage serial-delay circuit, specifically, the three-stage serial-delay circuit 340. The three-stage serial-delay circuit is a three-stage version of the four-stage serial-delay circuit 140 described above with reference to FIG. 5A, and will not be described further. The data outputs of the stages 142-1, 142-2 and 142-3 are connected to the clock outputs 134-1, 134-2 and 134-3.

The outputs of the stages 142-1, 142-2 and 142-3 of the multi-stage serial-delay circuit 340 constituting the interleaved clock signal generator of the second type 104-1 provide three of the 12 interleaved clock signals, namely, interleaved clock signals K1, K2 and K3, respectively. The outputs of the stages 122-1, 122-2 and 122-3 of the multi-stage serial-delay circuit 340 constituting the interleaved clock signal generator of the second type 104-2 provide a further three of the 12 interleaved clock signals, namely, interleaved clock signals K4, K5 and K6, respectively. The outputs of the stages 122-1, 122-2 and 122-3 of the multi-stage serial-delay circuit 340 constituting the interleaved clock signal generator of the second type 104-3 provide a further three of the 12 interleaved clock signals, namely, interleaved clock signals K7, K8 and K9. The outputs of the stages 122-1, 122-2 and 122-3 of the multi-stage serial-delay circuit 340 constituting the interleaved clock signal generator of the second type 104-4 provide the final three of the 12 interleaved clock signals, namely, interleaved clock signals K10, K11 and K11. Thus, in this example, the interleaved clock generators of the second type 104-1 to 104-4 output the interleaved clock signals K1–K12 in a column-wise arrangement.

Figure 7B:
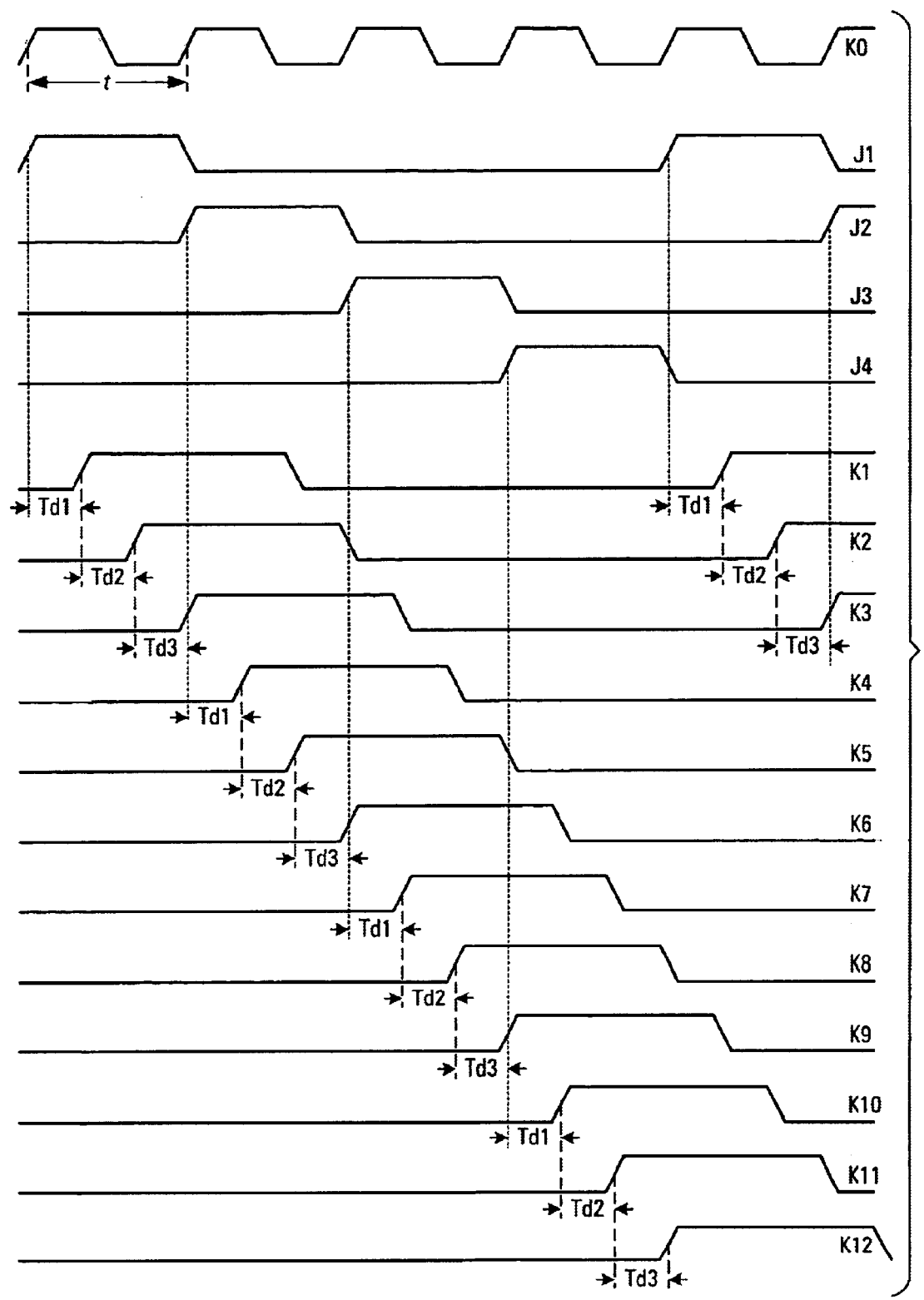
FIG. 7B is a set of graphs illustrating the operation of the interleaved clock generator shown in FIG. 7A.

FIG. 7B is a set of graphs illustrating the operation of the interleaved clock generator 310 shown in FIG. 7A in which N=12, M=4 and N/M=D=3. FIG. 7B shows the waveform of the input clock signal K0 and additionally shows the waveforms of the intermediate clock signals J1–J4 generated by the ring counter circuit 320 constituting the interleaved clock generator of the first type 102. The frequency of the intermediate clock signals J1–J4 is one-fourth of that of the input clock signal. The intermediate clock signals J1–J4 are progressively delayed in time relative to the input clock signal by a time delay equal to one period t of the input clock signal.

FIG. 7B also shows the waveforms of the interleaved clock signals K1–K12. Each of the interleaved clock signals is progressively delayed in time relative to the intermediate clock signal in response to which it is generated by the time delay of the delay stages 142-1 to 142-3 constituting the respective multi-stage serial delay circuit 340. The time delays of the delay stages 142-1, 142-2 and 142-3 are indicated as Td1, Td2 and Td3, respectively. The time delays of the delay stages are equal to the desired time delay Td, which corresponds to one third of the period t of the input clock signal.

The frequency of each of the interleaved clock signals K1–K12 is equal to that of the intermediate clock signals. Thus, the frequency of the input clock signal is only four times that of the interleaved clock signals even though the interleaved clock generator 100 generates 12 interleaved clock signals.

In FIG. 7B, a broken line and the time delay indicator Td1 connect the positive-going edge of each of the intermediate clock signals J1–J4 to the positive-going edge of the first of the three interleaved clock signals that are generated from it by the respective one of the interleaved clock signal generators of the second type 104-1 to 104-4. For example, a broken line and the time delay indicator Td1 connect the positive-going edge of the intermediate clock signal J3 to the interleaved clock signal K7, which is the first of the three interleaved clock signals K7, K8 and K9 that are generated from the intermediate clock signal J3 by the interleaved clock signal generator of the second type 104-3.

Figure 7C:
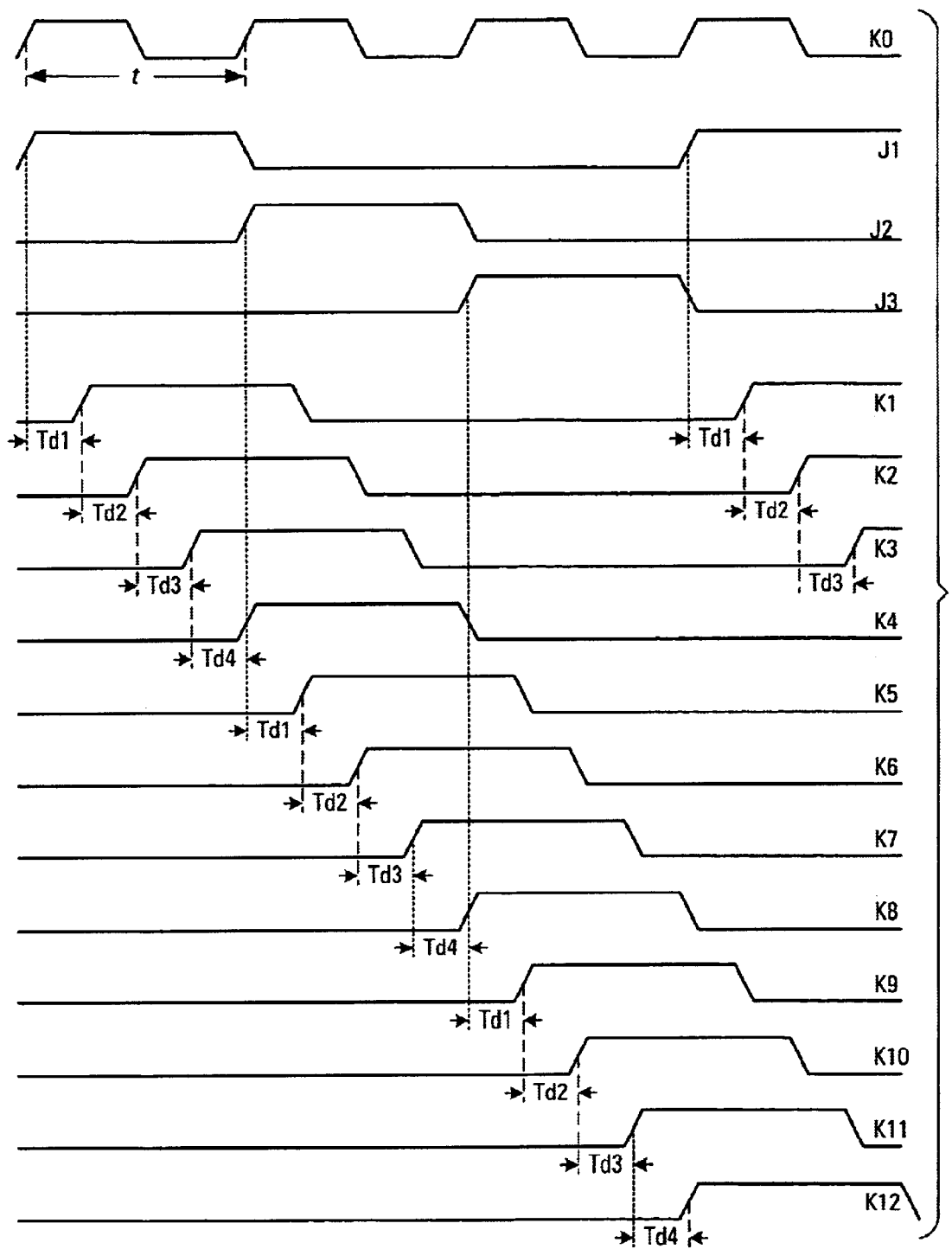
FIG. 7C is a set of graphs illustrating the operation of a variation on the interleaved clock generator shown in FIG. 7A in which M=3 and D=4.

FIG. 7C is a set of graphs illustrating the operation of a variation on the interleaved clock generator 310 shown in FIG. 7A. In the variation, the interleaved clock generator of the first type is composed of a three-stage ring counter circuit and each of three interleaved clock generators of the second type is composed of a four-stage serial delay circuit. In other words, N=12, M=3 and D=4 in this variation. FIG. 7C shows the waveform of the input clock signal K0 and additionally shows the waveforms of the three intermediate clock signals J1–J3 generated by the three-stage ring counter circuit constituting the interleaved clock generator of the first type. The frequency of the intermediate clock signals J1–J3 is one-third of that of the input clock signal. The intermediate clock signals are progressively delayed in time relative to the input clock signal by a time delay equal to one period t of the input clock signal.

FIG. 7C also shows the waveforms of the interleaved clock signals K1–K12. Each of the interleaved clock signals is progressively delayed in time relative to the intermediate clock signal from which it is generated by the time delay of the four delay stages constituting the respective multi-stage serial delay circuit. The time delays of the four delay stages are indicated as Td1, Td2, Td3 and Td4 respectively. The time delays of the delay stages are equal to the desired time delay Td, which corresponds to one quarter of the period t of the input clock signal.

In FIG. 7C, a broken line and the time delay indicator Td1 connect the positive-going edge of each of the intermediate clock signals J1–J3 to the positive-going edge of the first of the four interleaved clock signals that are generated from it by the respective one of the three interleaved clock signal generators of the second type. For example, a broken line and the time delay indicator Td1 connect the positive-going edge of the intermediate clock signal J2 to the interleaved clock signal K5, which is the first of the four interleaved clock signals K5, K6, K7 and K8 that are generated in response to the intermediate clock signal J2 by one of the interleaved clock signal generators of the second type.

In the variation whose operation is illustrated in FIG. 7C, the frequency of each of the interleaved clock signals is equal to that of the intermediate clock signals, so the frequency of the input clock signal is three times that of the interleaved clock signals even though the interleaved clock generator generates 12 interleaved clock signals. The frequency of the input clock signal is lower than that in the interleaved clock generator 310 shown in FIG. 7A and whose operation is illustrated in FIG. 7B. However, the maximum number of stages that the input clock signal K0 passes through between the input clock input 112 and any of the clock outputs 134-1 to 134-D is five. In the interleaved clock generator 310 shown in FIG. 7A, the maximum number of stages through which the input clock signal passes is four.

In embodiments of the interleaved clock generator 310 in which D is an even number, the ring counter circuit 320 may be configured to generate differential intermediate clock signals and the multi-stage serial-delay circuits 340 may incorporate differential tuned delay stages in a manner similar to the interleaved clock generator 210 shown in FIG. 6A.

Examples of the interleaved clock generator 100 have been described above with reference to examples in which conventional ring counters have been used as the ring counter circuits 120 and 320. However, other circuits may be used as the ring counter circuits 120 and 320.

Figure 8A:
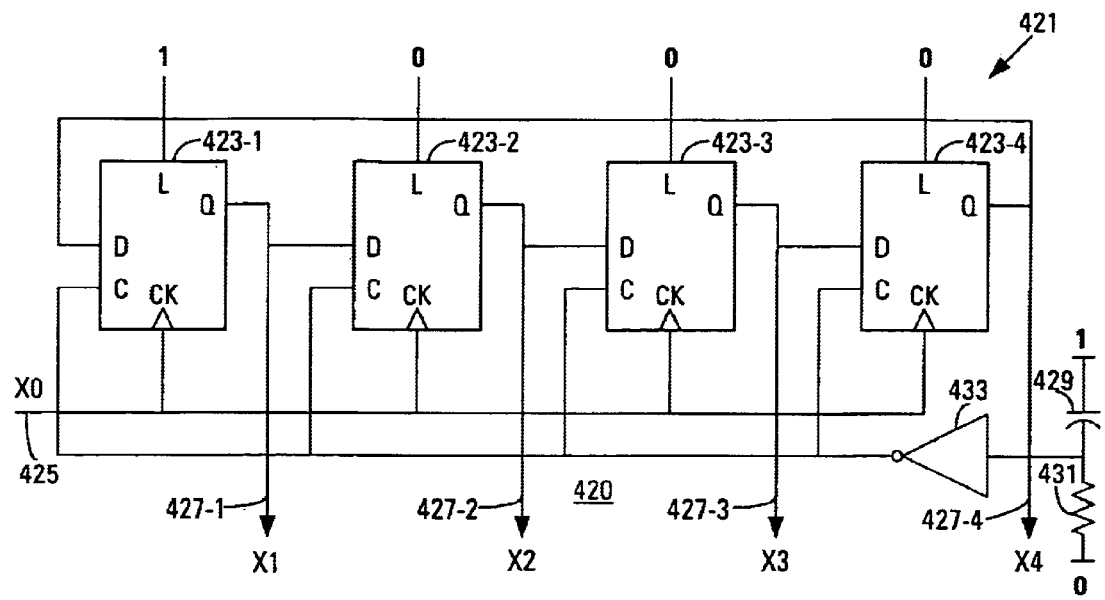
FIG. 8A is a block diagram of an example of a ring counter circuit based on a looped shift register.

FIG. 8A is a block diagram of an example 420 of a ring counter circuit based on the looped shift register 421. A four-stage example is shown. The four-stage ring counter circuit receives the first clock signal X0 and generates the four output second signals X1, X2, X3 and X4 in response to the first clock signal. In an embodiment of the interleaved clock generator according to the invention in which the interleaved clock generator of the first type 102 includes a four-stage ring counter circuit, the input clock signal K0 provides the first clock signal X0 and the second clock signals X1–X4 provide the intermediate clock signals J1–J4. In an embodiment of the interleaved clock generator according to the invention in which each of the interleaved clock generators of the second type 104-1 to 104M includes a four-stage ring counter circuit, one of the intermediate clock signals J1–JM provides the first clock signal X0 and the second clock signals X1–X4 provide four of the interleaved clock signals K1–KN. Modifications to the example to provide a ring counter circuit that generates a different number of second clock signals will be apparent to a person of ordinary skill in the art.

The looped shift register 420 is composed of the four shift register stages 423-1, 423-2, 423-3 and 423-4. Each of the stages includes a data input D, a clock input CK, a data output Q, a control input C and a load input L.

The data output of each of the stages 423-1 to 423-4 provides one of the second clock signals X1–X4, respectively, and is connected to a respective one of the second clock outputs 427-1 to 427-4. The data output of each of the stages 423-1, 423-2 and 423-3 is additionally connected to the data input of the stages 423-2, 423-3 and 423-4, respectively. The data output of the stage 423-4 is additionally connected to the data input of the stage 423-1 for form the loop. The clock input CK of each of the stages is connected to the first clock input 425. The control input C of each of the stages is connected to the output of the inverter 433, to be described below.

The load input L of each of the stages is connected to a source of a low (0) or a high state (1) that defines the state that will be loaded into the stage at power on. In the example shown, the load input of stage 423-1 is connected to a 1 and the load inputs of stages 423-2 to 423-4 are connected to 0s. The load inputs of more than one of the stages may be connected to 1s provided that the stages are contiguous and that the load input of at least one of the stages is connected to a 0.

The capacitor 429 and the resistor 431 are connected in series between the high state (1) and the low state (0). The node between the capacitor and the resistor is connected to the input of the inverter 433. The output of the inverter is connected to the control inputs L/R of the stages 423-1 to 423-4.

At power on, the capacitor 429 pulls the input of the inverter 433 high, which holds the output of the inverter low. The voltage on the capacitor then decays until the input of the inverter reaches the low state. This causes the output of the inverter to go to the high state. The resulting positive-going edge on the control input L/R of each of the stages 423-1 to 423-4 sets the data output Q of the stage to the state present on the load input L of the state. In the example shown, the data outputs Q of the stages 423-1 to 423-4 are set to 1, 0, 0, 0, respectively.

After the initial load operation just described, on each positive-going edge of the first clock signal X0 received at the first clock input 425, each of the shift register stages 423-1 to 423-4 shifts the state present at its data input D to its data output Q. In an example in which, at power on, the data output of stage 423-1 is set to a 1 state and the data outputs of stages 423-2 to 423-4 are each set to a 0 state, the 0 state output by stage 423-4 is present at the input of stage 423-1. The next positive-going edge of the first clock signal X0 shifts the 0 state at the input of stage 423-1 to the data output of this stage, and the second clock signal X1 changes from 1 to 0. This positive-going edge of the first clock signal shifts the 1 state at the input of stage 423-2 to the data output of this stage and the second clock signal X2 changes from 0 to 1. The outputs of the remaining stages remain unchanged because these stages shift 0s at their data inputs to their data outputs, which were previously in the 0 state.

On the next three positive-going edges respectively, of the first clock signal, changes similar to those just described in the output states of stages 423-1 and 423-2 occur in the output states of stages 423-2 and 423-3, 423-3 and 423-4, and 423-4 and 423-1, respectively. On the next positive-going edge of the first clock signal, the output states of the stages return to the original output states loaded into the stages at power on. The above-described sequence repeats every four positive-going edges of the first clock signal.

Figure 8B:
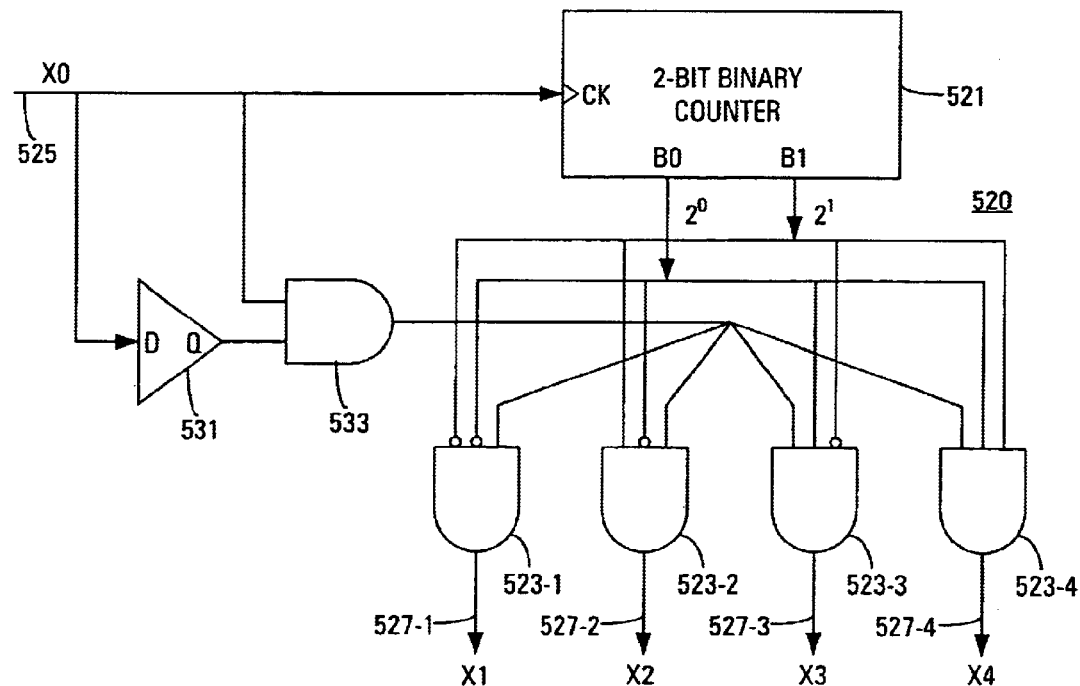
FIG. 8B is a block diagram of an example of a ring counter circuit based on a binary counter.

FIG. 8B is a block diagram of an example 520 of a ring counter circuit based on the binary counter 521. A four-stage ring counter circuit example is shown. The four-stage ring counter circuit receives the first clock signal X0 and generates the four second clock signals X1, X2, X3 and X4 in response to the first clock signal. Modifications to the example to provide a ring counter circuit that generates a different number of second clock signals will be apparent to a person of ordinary skill in the art.

The ring counter circuit 520 is composed of the binary counter 521, the four decoder gates 523-1, 523-2, 523-3 and 523-4, the delay stage 531 and the AND gate 533. In this four-stage example, the binary counter is a two-bit binary counter that includes the clock input CK, the less-significant bit output LSB and the more-significant bit output MSB. The clock input is connected to the first clock input 527.

Each of the decoder gates 523-1, 523-2, 523-3 and 523-4 is a three input AND gate. The output of each of the decoder gates 523-1 to 523-4 provides one of the second clock signals X1 to X4 and is connected to a respective one of the second clock outputs 527-1, 527-2, 527-3 and 527-4.

The decoder gates 523-1, 523-2, 523-3 and 523-4 each have three inputs, one of which is non-inverting and is connected to the output of the AND gate 533. The remaining two inputs of each of the decoder gates are connected to the bit outputs LSB and MSB of the binary counter 521 as follows. The decoder gate 523-1 has two inverting inputs, one of which is connected to the output LSB, the other of which is connected to the output MSB. The decoder gate 523-2 has one non-inverting input connected to the output LSB and one inverting input connected to the output MSB. The decoder gate 523-3 has one inverting input connected to the output LSB and one non-inverting input connected to the output MSB. The decoder gate 523-4 has two non-inverting inputs, one of which is connected to the output LSB, the other of which is connected to the output MSB.

The delay stage 531 has a delay greater than the maximum settling time of the outputs LSB and MSB of the binary counter 521. This delay is typically less than one quarter period of the first clock signal X0. The input of the delay stage is connected to the first clock input 525. The output of the delay stage is connected to one input of the AND gate 533. The other input of the AND gate is connected to the first clock signal input 525. The output of the AND gate is connected to one non-inverting input of each of the decoder gates 523-1 to 523-4, as described above.

The binary counter 521 counts the input clock signal X0 to generate successive value of the output bits LSB and MSB. The decoder gates decode the output bits of the binary counter to generate the second clock signals X1–X4, each of which is high for one period in four successive periods of the input clock signal, as shown in Table 3.

TABLE 2

| Period | LSB | MSB | X1 | X2 | X3 | X4 |
|--------|-----|-----|----|----|----|----|
| 1 | 0 | 0 | 1 | 0 | 0 | 0 |
| 2 | 1 | 0 | 0 | 1 | 0 | 0 |
| 3 | 0 | 1 | 0 | 0 | 1 | 0 |

TABLE 2-continued

| Period | LSB | MSB | X1 | X2 | X3 | X4 |
|--------|-----|-----|----|----|----|-----|
| 4      | 1   | 1   | 0  | 0  | 0  | 1  |
| 5 (=1) | 0   | 0   | 1  | 0  | 0  | 0  |

The delay stage 531 and the AND gate 533 collectively generate a delayed-edge version of the first clock signal. The positive-going edge of the delayed-edge version of the first clock signal is delayed relative to the positive-going edge of the first clock signal by the delay of the delay stage. The delayed-edge version of the first clock signal is fed to the decoding gates, where it holds the outputs of the decoding gates in the 0 state until it changes stage from 0 to 1. This effectively synchronizes the positive-going edges of the second clock signals X1–X4 to the positive-going edges of delayed-edge version of the first signal, and ensures that the second clock signals X1–X4 are temporally equally spaced within the period of the second clock signals, as described above, notwithstanding the differing numbers of stages between the first clock signal and the outputs of the binary counter 521.

Other circuits capable of operating as a ring counter circuit are known in the art and may be used instead of the examples described above.

Ring counter circuits and multi-stage serial-delay circuits based on many different types of active devices, such as, but not limited to, bipolar, J-FET, P-MOS, N-MOS and CMOS are well known in the art and can be used to build the interleaved clock generators according to the invention.

The invention has been described with reference to examples in which elements operate in response to the positive-going edges of signals. However, this is not critical to the invention: elements may operate in response to the negative-going edges of signals. Moreover, the invention has been described with reference to examples in which a high state indicates a logical 1 and a low state indicates a logical 0. However, this is not critical to the invention: a high state may indicate a logical 0 and a low state indicates a logical 1.

This disclosure describes the invention in detail using illustrative embodiments. However, it is to be understood that the invention defined by the appended claims is not limited to the precise embodiments described.

I claim:

1. An interleaved clock generator for generating N interleaved clock signals in response to an input clock signal, where N is a non-prime integer, the interleaved clock generator comprising:
    interleaved clock generator means of a first type for receiving the input clock signal and for generating in response thereto M interleaved intermediate clock signals, where M is a factor of N and is an integer greater than unity, the interleaved clock generator means of the first type including one of (a) a multi-stage serial-delay circuit and (b) a ring counter circuit; and
    M interleaved clock generator means of a second type, each for receiving a respective one of the intermediate clock signals from the clock generator means of the first type and for generating in response thereto N/M of the N interleaved clock signals, each of the interleaved clock generator means of the second type including the other of (a) the multi-stage serial-delay circuit and (b) the ring counter circuit, wherein:
    corresponding edges of temporally adjacent ones of the interleaved clock signals differ in time by a time delay Td;
    the interleaved clock signals have a frequency of 1/(N*Td);
    the input clock signal has a frequency of 1/(M*Td) when the interleaved clock generator means of the first type includes the multi-stage serial delay circuit; and
    the input clock signal has a frequency of M/(N*Td) when the interleaved clock generator means of the first type includes the ring counter circuit.

2. The interleaved clock generator of claim 1, in which the multi-stage serial-delay circuit includes a delay-locked loop.

3. The interleaved clock generator of claim 1, in which the multi-stage serial-delay circuit includes a phase-locked loop.

4. The interleaved clock generator of claim 1, in which:
    the interleaved clock generator means of the first type includes the multi-stage serial delay circuit; and
    each of the interleaved clock signal generator means of the second type includes the ring counter circuit.

5. The interleaved clock generator of claim 4, in which the ring counter circuit includes an N/M-stage ring counter.

6. The interleaved clock generator of claim 4, in which the multi-stage serial-delay circuit includes M delay stages, each providing one of the intermediate clock signals.

7. An interleaved clock generator for generating N interleaved clock signals in response to an input clock signal, where N is a non-prime integer, the interleaved clock generator comprising:
    interleaved clock generator means of a first type for receiving the input clock signal and for generating in response thereto M interleaved intermediate clock signals, where M is a factor of N and is an integer greater than unity, the interleaved clock generator means of the first type including a multi-stage serial-delay circuit; and
    M interleaved clock generator means of a second type, each for receiving a respective one of the intermediate clock signals from the clock generator means of the first type and for generating in response thereto N/M of the N interleaved clock signals, each of the interleaved clock generator means of the second type including a ring counter circuit, wherein:
    the input clock signal comprises differential clock signals each having a 50% duty cycle; and
    the multi-stage serial-delay circuit includes M/2 delay stages, each providing two of the intermediate clock signals.

8. An interleaved clock generator for generating N interleaved clock signals in response to an input clock signal, where N is a non-prime integer, the interleaved clock generator comprising:
    interleaved clock generator means of a first type for receiving the input clock signal and for generating in response thereto M interleaved intermediate clock signal; where M is a factor of N and is an integer greater than unity, the interleaved clock generator means of the first type including a ring counter circuit; and
    M interleaved clock generator means of a second type, each for receiving a respective one of the intermediate clock signals from the clock generator means of the first type and for generating in response thereto N/M of the N interleaved clock signals, each of the interleaved clock signal generator means of the second type including a multi-stage serial-delay circuit.

9. The interleaved clock generator of claim 8, in which the ring counter circuit includes an M-stage ring counter.

10. The interleaved clock generator of claim 8, in which the multi-stage serial-delay circuit includes N/M delay stages, each providing one of the interleaved clock signals.

11. The interleaved clock generator of claim 8, in which:
   each intermediate clock signal comprises differential clock signals each having a 50% duty cycle; and
   the multi-stage serial-delay circuit includes N/2M delay stages, each providing two of the interleaved clock signals.

12. An interleaved clock generator for generating N interleaved clock signals in response to an input clock signal, where N is a non-prime integer, the interleaved clock generator comprising:
   an interleaved clock generator of a first type, including a clock input connected to receive the input clock signal, M intermediate clock outputs, where M is a factor of N and is an integer greater than unity, and one of (a) a multi-stage serial-delay circuit and (b) a ring counter circuit, the interleaved clock generator of the first type operating in response to the input clock signal to output a respective intermediate clock signal at each of the intermediate clock outputs; and
   M interleaved clock generators of a second type, each including an intermediate clock input connected to a different one of the M intermediate clock outputs of the interleaved clock signal generator of the first type, N/M clock outputs and the other of (a) the multi-stage serial-delay circuit and (b) the ring counter circuit, each of the interleaved clock generators of the second type operating in response to the intermediate clock signal to output a respective one of N/M of the interleaved clock signals at each of the clock outputs, wherein:
   corresponding edges of temporally adjacent ones of the interleaved clock signals differ in time by a time delay Td;
   the interleaved clock signals have a frequency of 1/(N*Td);
   the input clock signal has a frequency of 1/(M*Td) when the interleaved clock generator of the first type includes the multi-stage serial delay circuit;
   the input clock signal has a frequency of M/(N*Td) when the interleaved clock generator of the first type includes the ring counter circuit.

13. The interleaved clock generator of claim 12, in which:
   the interleaved clock generator of the first type includes the multi-stage serial-delay circuit; and
   each of the interleaved clock signal generators of the second type includes the ring counter circuit.

14. The interleaved clock generator of claim 13, in which the ring counter circuit includes an N/M-stage ring counter.

15. The interleaved clock generator of claim 13, in which the multi-stage serial-delay circuit includes M delay stages, each providing one of the intermediate clock signals.

16. An interleaved clock generator for generating N interleaved clock signals in response to an input clock signal, where N is a non-prime integer, the interleaved clock generator comprising:
   an interleaved clock generator of a first type, including a clock input connected to receive the input clock signal, M intermediate clock outputs, where M is a factor of N and is an integer greater than unity, and a ring counter circuit, the interleaved clock generator of the first type operating in response to the input clock signal to output a respective intermediate clock signal at each of the intermediate clock outputs; and
   M interleaved clock generators of a second type, each including an intermediate clock input connected to a different one of the M intermediate clock outputs of the interleaved clock signal generator of the first type, N/M clock outputs and a multi-stage serial-delay circuit, each of the interleaved clock generators of the second type operating in response to the intermediate clock signal to output a respective one of N/M of the interleaved clock signals at each of the clock outputs multi-stage serial-delay circuit.

17. The interleaved clock generator of claim 16, in which:
   corresponding edges of temporally-adjacent ones of the interleaved clock signals differ in time by a time delay Td;
   the interleaved clock signals have a frequency of 1/(N*Td); and
   the input clock signal has a frequency of M/(N*Td).

18. The interleaved clock generator of claim 16, in which:
   each intermediate clock signal comprises differential clock signals each having a 50% duty cycle; and
   the multi-stage serial-delay circuit includes N/2M delay stages, each providing two of the interleaved clock signals.

19. An interleaved clock generator for generating N interleaved clock signals in response to an input clock signal, where N is a non-prime integer, the interleaved clock generator comprising;
   a multi-stage serial-delay circuit connected to receive the input clock signal, the multi-stage serial-delay circuit including M intermediate clock outputs where M is a factor of N and is an integer greater than unity; and
   connected to each of the M intermediate clock outputs, a ring counter circuit that generates N/M of the N interleaved clock signals, in which:
   corresponding edges of temporally-adjacent ones of the interleaved clock signals differ in time by a time delay Td;
   the interleaved clock signals have a frequency of 1/(N*Td); and
   the input clock signal has a frequency of 1/(M*Td).

20. The interleaved clock generator of claim 19 in which the ring counter circuit comprises an N/M-stage ring counter.

21. An interleaved clock generator for generating N interleaved clock signals in response to an input clock signal, where N is a non-prime integer, the interleaved clock generator comprising:
   a multi-stage serial-delay circuit connected to receive the input clock signal, the multi-stage serial-delay circuit including M intermediate clock outputs where M is a factor of N and is an integer greater than unity; and
   connected to each of the M intermediate clock outputs, a ring counter circuit that generates N/M of the N interleaved clock signals, in which:
   each intermediate clock signal comprises differential clock signals each having a 50% duty cycle; and
   the multi-stage serial-delay circuit includes M/2 delay stages, each providing two of the intermediate clock signals.

22. An interleaved clock generator for generating N interleaved clock signals in response to an input clock signal, where N is a non-prime integer, the interleaved clock generator comprising:
   a ring counter circuit connected to receive the input clock signal, the ring counter circuit including M intermediate clock outputs, where M is a factor of N and is an integer greater than unity; and connected to each of the M intermediate clock outputs, a multi-stage delay circuit that generates N/M of the N interleaved clock signals.

23. The interleaved clock generator of claim 22, in which the ring counter circuit comprises an M-stage ring counter.

24. The interleaved clock generator of claim 22, in which:

corresponding edges of temporally-adjacent ones of the interleaved clock signals differ in time by a time delay Td;

the interleaved clock signals have a frequency of 1/(N*Td); and the input clock signal has a frequency of M/(N*Td).

25. The interleaved clock generator of claim 22, in which:

each intermediate clock signal comprises differential clock signals each having a 50% duty cycle; and the multi-stage serial-delay circuit includes N/2M delay stages, each providing two of the interleaved clock signals.

* * * * *